United States Patent
Kudikala et al.

(10) Patent No.: US 9,805,328 B2
(45) Date of Patent: *Oct. 31, 2017

(54) NUMERICAL GRAPHICAL FLOW DIAGRAM CONVERSION AND COMPARISON

(71) Applicant: International Business Machines Corporation, Armonk, NY (US)

(72) Inventors: Shravan K. Kudikala, Hyderabad (IN); Amar A. Shah, Pune (IN); Swikar K. Sugandhi, Pune (IN)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/812,504

(22) Filed: Jul. 29, 2015

(65) Prior Publication Data

US 2015/0332180 A1    Nov. 19, 2015

Related U.S. Application Data

(63) Continuation of application No. 12/915,906, filed on Oct. 29, 2010, now Pat. No. 9,134,960.

(51) Int. Cl.
*G06F 17/22*    (2006.01)
*G06Q 10/06*    (2012.01)
(Continued)

(52) U.S. Cl.
CPC ............ *G06Q 10/067* (2013.01); *G06F 8/10* (2013.01); *G06F 17/2247* (2013.01); *G06F 17/50* (2013.01); *G06F 9/4443* (2013.01)

(58) Field of Classification Search
CPC .......... G06F 8/10; G06F 9/4443; G06F 17/50; G06F 17/2247; G06Q 10/067
(Continued)

(56) References Cited

U.S. PATENT DOCUMENTS 5,974,254 A    10/1999  Hsu
7,603,654 B2   10/2009  Kharitidi et al.
(Continued)

OTHER PUBLICATIONS

United States Patent and Trademark Office, Office Action for U.S. Appl. No. 12/915,906, May 23, 2013, pp. 1-20, Alexandria, VA, USA.

(Continued)

*Primary Examiner* — Wei Zhen
*Assistant Examiner* — Mohammed Huda
(74) *Attorney, Agent, or Firm* — Lee Law, PLLC; Christopher B. Lee

(57) ABSTRACT

A computing device translates each of a group of structured language graphical process flow element representations, that each represents within a structured language one node of a captured graphical process flow diagram of a first business process, into one of a group of numerical strings that each represents within a set of data fields the respective node and connections to and from the respective node. The group of numerical strings is sequenced in accordance with values of the respective data fields within each numerical string that represents the respective node and the connections to and from each represented node of the captured graphical process flow diagram of the first business process.

16 Claims, 15 Drawing Sheets

(51) Int. Cl.
*G06F 17/50* (2006.01)
*G06F 9/44* (2006.01)

(58) Field of Classification Search
USPC .......................................................... 717/136
See application file for complete search history.

(56) References Cited

U.S. PATENT DOCUMENTS

| | | |
|---|---|---|
| 9,134,960 B2* | 9/2015 | Kudikala .................. G06F 8/10 |
| 2002/0039101 A1 | 4/2002 | Fernandez et al. |
| 2002/0099735 A1 | 7/2002 | Schroeder et al. |
| 2003/0188264 A1 | 10/2003 | Nawathe et al. |
| 2004/0088660 A1* | 5/2004 | Tran .................... G06F 17/5068 716/119 |
| 2005/0193380 A1* | 9/2005 | Vitanov ................ G06F 9/4443 717/143 |
| 2008/0019378 A1 | 1/2008 | Hogan |
| 2010/0088676 A1 | 4/2010 | Yuan et al. |
| 2010/0131394 A1* | 5/2010 | Rutsch ................ G06Q 40/123 705/31 |
| 2010/0138775 A1 | 6/2010 | Kohen et al. |

OTHER PUBLICATIONS

United States Patent and Trademark Office, Office Action for U.S. Appl. No. 12/915,906, Dec. 19, 2013, pp. 1-18, Alexandria, VA, USA.
United States Patent and Trademark Office, Office Action for U.S. Appl. No. 12/915,906, Dec. 5, 2014, pp. 1-21, Alexandria, VA, USA.
United States Patent and Trademark Office, Notice of Allowance for U.S. Appl. No. 12/915,906, May 5, 2015, pp. 1-39, Alexandria, VA, USA.

* cited by examiner

700

| SORT KEY | DESCRIPTION | |
|---|---|---|
| SK 1 | SORTED ON 'NODE INFORMATION'- TYPE | 702 / 704 |
| SK 2 | SORTED ON 'NODE INFORMATION'- ID | 706 |
| SK 3 | COUNT OF CONNECTION C | 708 |
| SK 4 | O/P TERMINAL TYPE | 710 |
| SK 5 | 'TO NODE' I/P TERMINAL TYPE | 712 |
| SK 6 | 'TO NODE' TYPE | 714 |
| SK 7 | 'TO NODE' ID | 716 |
| SK 8 | 'TO NODE' SEQ NO. (USED IN STEP 5) | 718 |
| SK 9 | I/P TERMINAL TYPE | 720 |
| SK 10 | 'FROM NODE' O/P TERMINAL TYPE | 722 |
| SK 11 | 'FROM NODE' TYPE | 724 |
| SK 12 | 'FROM NODE' ID | 726 |
| SK 13 | 'FROM NODE' SEQ NO. (USED IN STEP 5) | |

NUMERICAL GRAPHICAL FLOW DIAGRAM CONVERSION AND COMPARISON

BACKGROUND

The present invention relates to graphical flow diagram analysis. More particularly, the present invention relates to numerical graphical flow diagram conversion and comparison.

Graphical user interface (GUI) tools allow users to create graphical flow diagrams. Graphical flow diagrams may be created, for example, to represent flow logic for enterprise and data product and process modeling. The graphical flow diagrams may be represented for storage in text-based formats, such as extensible markup language (XML) or other text-based formats.

SUMMARY

A method includes translating, via a computing device, each of a plurality of user interface element representations that each represents one node of a captured graphical logic flow into one of a plurality of numerical strings that represents the respective node and connections to and from the respective node; and sequencing the plurality of numerical strings based upon the connections to and from each represented node.

A system includes a memory; and a processor programmed to translate each of a plurality of user interface element representations that each represents one node of a captured graphical logic flow into one of a plurality of numerical strings that represents the respective node and connections to and from the respective node; and sequence the plurality of numerical strings based upon the connections to and from each represented node.

A computer program product includes a computer readable storage medium including computer readable program code, where the computer readable program code when executed on a computer causes the computer to translate each of a plurality of user interface element representations that each represents one node of a captured graphical logic flow into one of a plurality of numerical strings that represents the respective node and connections to and from the respective node; and sequence the plurality of numerical strings based upon the connections to and from each represented node.

DETAILED DESCRIPTION

Figure 1:
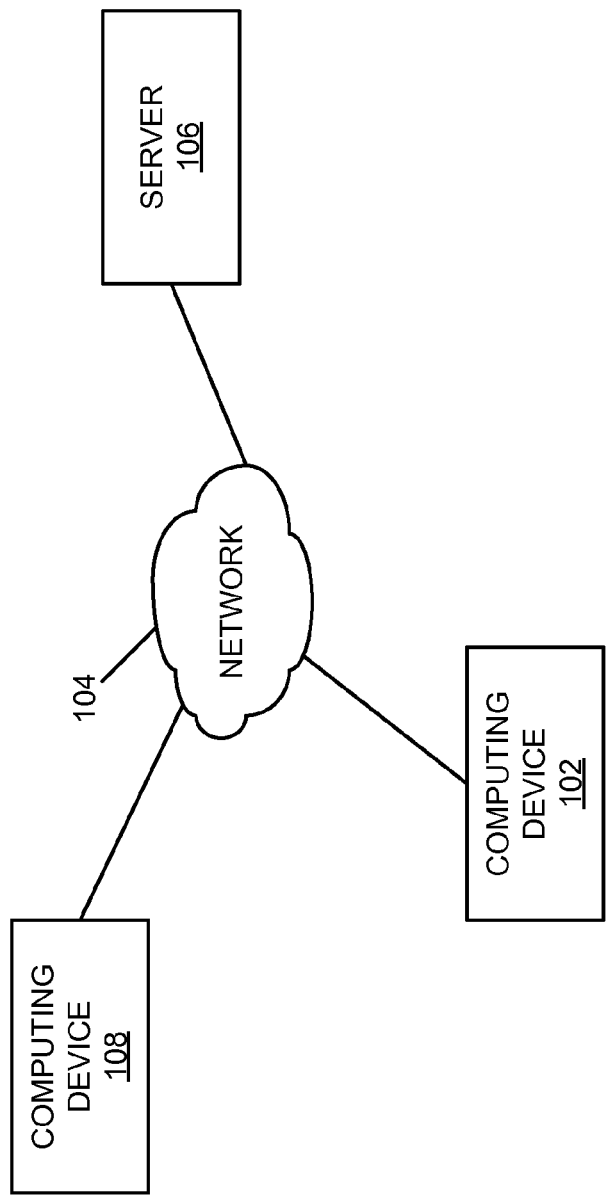
FIG. 1 is a block diagram of an example of an implementation of a system for automated numerical graphical flow diagram conversion and comparison according to an embodiment of the present subject matter.

The examples set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The subject matter described herein provides numerical graphical flow diagram conversion and comparison. As described in detail below, multiple graphical logic flows captured in one or more structural language representations may be compared. A structural language representation may include, for example, extensible markup language (XML) or other structural language representation. As such, the present subject matter bridges a gap between disparate graphical flow capture tool outputs to provide comparison of captured graphical logic flows. The present subject matter also operates to determine similarities and differences between different renderings of the same graphical logic flows captured in different sequences by a single graphical logic flow tool.

Each graphical logic flow represented in a structural language may be translated/converted to a numeric format called an element information structure (EIS) herein using enumeration tables. The EIS is a numeric representation that considers a node type and node identifier (ID) of each node, and interconnections and terminal types associated with the interconnections. Each such element is represented within one or more enumeration tables and assigned a value. The value of each element is selected and placed within the generated EIS for each graphical logic flow structural language representation. The generated EIS for each captured logic flow is stored to memory. By storing the graphical flow representations in numeric format, memory consumption for storage, sorting, and comparison may be reduced. Additionally, comparison of multiple captured logic flows may be faster than other text based comparison mechanisms. Sorting and sequencing of the respective EIS arrays is performed to normalize the respective graphical logic flow structural language representations within the numeric format. For purposes of the present description, "numeric normalization" may include imposition of structural language (e.g., XML) data to a standardized numeric form for comparison. The structural language data are translated to a numerical representation of arrays. This numerical representation of arrays is processed into a sequenced numeric form for comparison. The transformation from structural language data to numeric data in a sequenced numeric form for comparison is considered numeric normalization herein. The transformed numeric structures may be compared to determine whether the logic represented within the captured structural language representations are identical or different, and reports of the determinations may be generated.

The subject matter described herein may be used to process output generated by a variety of graphical flow diagram capture applications. For example, graphical flow diagrams may be created using products including enterprise service bus (ESB)-oriented products, such as Websphere® Message Broker (WMB), WebSphere® Enterprise Service Bus (WESB), and DataPower®. Further, business process modeler products such as business process management (BPM) and data warehouse tools such as DataStage® may be used to create graphical flow diagrams. However, while the examples described herein utilize graphical flow diagrams, such as those generated using the products described above, it should be understood that the graphical flow diagrams are not limited to diagrams generated using these products. The flow diagrams may, for example, reflect other directed graphs like electrical circuitry diagrams, flow charts, or other captured diagrams that are digitally represented using any modeling software. Accordingly, any such flow diagrams are considered within the scope of the present subject matter.

The business logic may first be developed in the graphical user interface (GUI), with a sequence of nodes (each having a specific functionality) wired together to form a meaningful logical connection and an intended order of processing. These nodes and sequences may be named differently in different products. This graphical approach provides flexibility for the users to build their business logic with minimal coding.

It has been observed that graphical flow diagrams are often represented in a text-based format for export or storage. Storage of artifacts generated during the graphical creation process may further be rendered in a proprietary or custom format bringing additional challenges to comparing or evaluating duplicate records of business logic solutions that are constructed. Each tool used to create a text-based formatted representation of a graphical flow diagram may yield a different text-based representation. Additionally, a user-sequence of operations during creation of a flow diagram may result in a different representation relative to the same flow diagram created in a different sequence.

For example, in Websphere® Message Broker, created artifacts are named "message flows," while in DataStage® these artifacts are named "Jobs." Each job/flow has a unique name and that name is the only way to determine duplicate records. If there are two jobs/flows with different names and the same business logic, then the systems are incapable of detecting them as duplicates despite the fact that they are stored in extensible markup language (XML).

The present subject matter provides improvements over text-based comparison or complex XML tree object comparison. Additionally, a concept of a "connection" element and "connection attributes" provide improved comparison evaluation by defining business logic in a manner that alleviates issues of automated name selection based upon a user-entry sequence of elements. Additional benefits will be apparent based upon the description below.

The examples described below consider the captured artifacts to be represented in XML format. However, it should be noted that the present subject matter is not limited to use in association with XML representations. The present subject matter may be applied to any structured language representations of graphical flow diagrams that provide a structured format for stored artifacts.

Prior to addressing detailed examples of numerical graphical flow diagram conversion and comparison, examples of architectural block diagrams of systems and components that may be used to implement the present subject matter will be described. It is noted that the examples described below may be modified as appropriate for a given implementation, and all such modifications are considered within the scope of the present subject matter.

Additionally, for purposes of nomenclature herein, "node" objects may be considered herein as objects responsible for doing certain jobs. Nodes may be labeled and classified as an "input," "processing," and "output" node. "Terminals" may be considered the connections to nodes from where the nodes receive a message or send a message to other nodes. Terminals may be considered of type "input" or "output." "Connections" may be considered the wires that directionally connect one node terminal to another node terminal to form some interconnected business logic based upon the nodes.

The numerical graphical flow diagram conversion and comparison described herein may be performed in real time to allow prompt conversion and comparison of captured graphical flow diagrams. For purposes of the present description, real time shall include any time frame of sufficiently short duration as to provide reasonable response time for information processing acceptable to a user of the subject matter described. Additionally, the term "real time" shall include what is commonly termed "near real time"—generally meaning any time frame of sufficiently short duration as to provide reasonable response time for on-demand information processing acceptable to a user of the subject matter described (e.g., within a portion of a second or within a few seconds). These terms, while difficult to precisely define are well understood by those skilled in the art.

FIG. 1 is a block diagram of an example of an implementation of a system 100 for automated numerical graphical flow diagram conversion and comparison. A computing device 102 communicates via a network 104 with a server 106. The server 106 may store structured representations of graphical flow diagrams created, for example, by a computing device 108, and may provide those to the computing device 102 for processing as described in more detail below.

As will be described in more detail below in association with FIG. 2 through FIG. 16, the computing device 102 provides automated numerical graphical flow diagram conversion and comparison. The automated numerical graphical flow diagram conversion and comparison is based upon conversion of structured representations of graphical flow diagrams to a numerical format. The automated numerical graphical flow diagram conversion and comparison is further based upon comparison of the converted numerical structured representations of graphical flow diagrams and determination of differences or similarities between multiple such representations. For purposes of the present examples, it is understood that the computing device 108 may use a graphical flow diagram capture program that generates structured language output of captured graphical flow diagrams in a format similar to that of the computing device 102 or in a different format. As such, the computing device 102 may process structural language output generated by the computing device 102 or the computing device 108 in the same or different structural language formats (e.g., XML or other structural language format), as appropriate for a given implementation.

It should be noted that the computing device 102 may be a portable computing device, either by a user's ability to move the computing device 102 to different locations, or by the computing device 102's association with a portable platform, such as a plane, train, automobile, or other moving vehicle. It should also be noted that the computing device 102 may be any computing device capable of processing information as described above and in more detail below. For example, the computing device 102 may include devices such as a personal computer (e.g., desktop, laptop, etc.) or a handheld device (e.g., cellular telephone, personal digital assistant (PDA), etc.), or any other device capable of processing information as described in more detail below.

The network 104 may include any form of interconnection suitable for the intended purpose, including a private or public network such as an intranet or the Internet, respectively, direct inter-module interconnection, dial-up, wireless, or any other interconnection mechanism capable of interconnecting the respective devices.

The server 106 may include any device capable of providing data for consumption by a device, such as the computing device 102, via a network, such as the network 104. As such, the server 106 may include a web server or other data server device. Further, while the present example illustrates multiple devices, it should be noted that the computing device 102 may generate, convert, and compare graphical flow diagrams without departure from the scope of the present subject matter.

Figure 2:
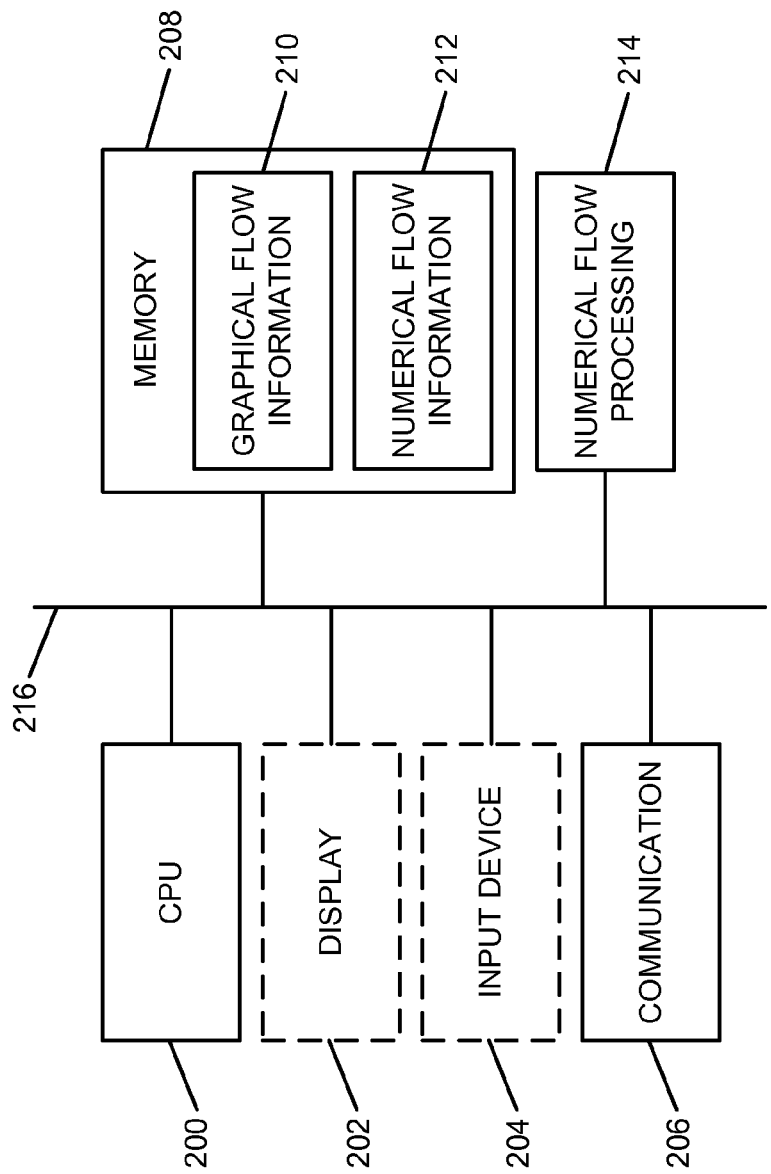
FIG. 2 is a block diagram of an example of an implementation of a computing device capable of performing automated numerical graphical flow diagram conversion and comparison according to an embodiment of the present subject matter.

FIG. 2 is a block diagram of an example of an implementation of the computing device 102 capable of performing automated numerical graphical flow diagram conversion and comparison. A central processing unit (CPU) 200 provides computer instruction execution, computation, and other capabilities within the computing device 102. A display 202 provides visual information to a user of the computing device 102 and an input device 204 provides input capabilities for the user.

The display 202 may include any display device, such as a cathode ray tube (CRT), liquid crystal display (LCD), light emitting diode (LED), projection, touchscreen, or other display element or panel. The input device 204 may include a computer keyboard, a keypad, a mouse, a pen, a joystick, or any other type of input device by which the user may interact with and respond to information on the display 202.

It should be noted that the display 202 and the input device 204 are illustrated with a dashed-line representation within FIG. 2 to indicate that they may be optional components for the computing device 102 for certain implementations. Accordingly, the computing device 102 may operate as a completely automated embedded device without user configurability or feedback. However, the computing device 102 may also provide user feedback and configurability via the display 202 and the input device 204, respectively.

A communication module 206 provides interconnection capabilities that allow the computing device 102 to communicate with other modules within the system 100, such as the server 106 and or the computing device 108, to retrieve structured representations of graphical flow diagrams for processing. The communication module 206 may include any electrical, protocol, and protocol conversion capabilities useable to provide the interconnection capabilities. Though the communication module 206 is illustrated as a component-level module for ease of illustration and description purposes, it should be noted that the communication module 206 may include any hardware, programmed processor(s), and memory used to carry out the functions of the communication module 206 as described above and in more detail below. For example, the communication module 206 may include additional controller circuitry in the form of application specific integrated circuits (ASICs), processors, antennas, and/or discrete integrated circuits and components for performing communication and electrical control activities associated with the communication module 206. Additionally, the communication module 206 may include interrupt-level, stack-level, and application-level modules as appropriate. Furthermore, the communication module 206 may include any memory components used for storage, execution, and data processing for performing processing activities associated with the communication module 206. The communication module 206 may also form a portion of other circuitry described without departure from the scope of the present subject matter.

A memory 208 includes a graphical flow information storage area 210 that stores structured representations, such as text-based or other representations, of captured graphical flow diagrams for the computing device 102. As will be described in more detail below, the structured representations of captured graphical flow diagrams stored within the graphical flow information storage area 210 are converted to a numerical format for comparison.

A numerical flow information storage area 212 stores converted numerical representations of the structured representations of captured graphical flow diagrams stored within the graphical flow information storage area 210. The numerical flow information storage area 212 also stores comparison results generated via comparison of multiple converted numerical representations of structured representations of captured graphical flow diagrams.

It is understood that the memory 208 may include any combination of volatile and non-volatile memory suitable for the intended purpose, distributed or localized as appropriate, and may include other memory segments not illustrated within the present example for ease of illustration purposes. For example, the memory 208 may include a code storage area, a code execution area, and a data area without departure from the scope of the present subject matter.

A numerical flow processing module 214 is also illustrated. The numerical flow processing module 214 provides numerical conversion and comparison capabilities for the computing device 102, as described above and in more detail below. The numerical flow processing module 214 implements the automated numerical graphical flow diagram conversion and comparison of the computing device 102.

Though the numerical flow processing module 214 is illustrated as a component-level module for ease of illustration and description purposes, it should be noted that the numerical flow processing module 214 may include any hardware, programmed processor(s), and memory used to carry out the functions of this module as described above and in more detail below. For example, the numerical flow processing module 214 may include additional controller circuitry in the form of application specific integrated circuits (ASICs), processors, and/or discrete integrated circuits and components for performing communication and electrical control activities associated with the respective devices. Additionally, the numerical flow processing module 214 may also include interrupt-level, stack-level, and application-level modules as appropriate. Furthermore, the numerical flow processing module 214 may include any memory components used for storage, execution, and data processing for performing processing activities associated with the module.

It should also be noted that the numerical flow processing module 214 may form a portion of other circuitry described without departure from the scope of the present subject matter. Further, the numerical flow processing module 214 may alternatively be implemented as an application stored within the memory 208. In such an implementation, the numerical flow processing module 214 may include instructions executed by the CPU 200 for performing the functionality described herein. The CPU 200 may execute these instructions to provide the processing capabilities described above and in more detail below for the computing device 102. The numerical flow processing module 214 may form a portion of an interrupt service routine (ISR), a portion of an operating system, a portion of a browser application, or a portion of a separate application without departure from the scope of the present subject matter.

The CPU 200, the display 202, the input device 204, the communication module 206, the memory 208, and the numerical flow processing module 214 are interconnected via an interconnection 216. The interconnection 216 may include a system bus, a network, or any other interconnection capable of providing the respective components with suitable interconnection for the respective purpose.

While the computing device 102 is illustrated with and has certain components described within, other modules and components may be associated with the computing device 102 without departure from the scope of the present subject matter. Additionally, it should be noted that, while the computing device 102 is described as a single device for ease of illustration purposes, the components within the computing device 102 may be co-located or distributed and interconnected via a network without departure from the scope of the present subject matter. For a distributed arrangement, the display 202 and the input device 204 may be located at a kiosk or other location, while the CPU 200 and memory 208 may be located at a local or remote server. Many other possible arrangements for components of the computing device 102 are possible and all are considered within the scope of the present subject matter. Accordingly, the computing device 102 may take many forms and may be associated with many platforms.

FIG. 3 through FIG. 16 below describe example flow diagrams and processes that may be executed by devices, such as the computing device 102, to perform the automated numerical graphical flow diagram conversion and comparison associated with the present subject matter. Many other variations on the example processes are possible and all are considered within the scope of the present subject matter. The example processes may be performed by modules, such as the numerical flow processing module 214 and/or executed by the CPU 200, associated with such devices. It should be noted that time out procedures and other error control procedures are not illustrated within the example processes described below for ease of illustration purposes. However, it is understood that all such procedures are considered to be within the scope of the present subject matter.

Figure 3:
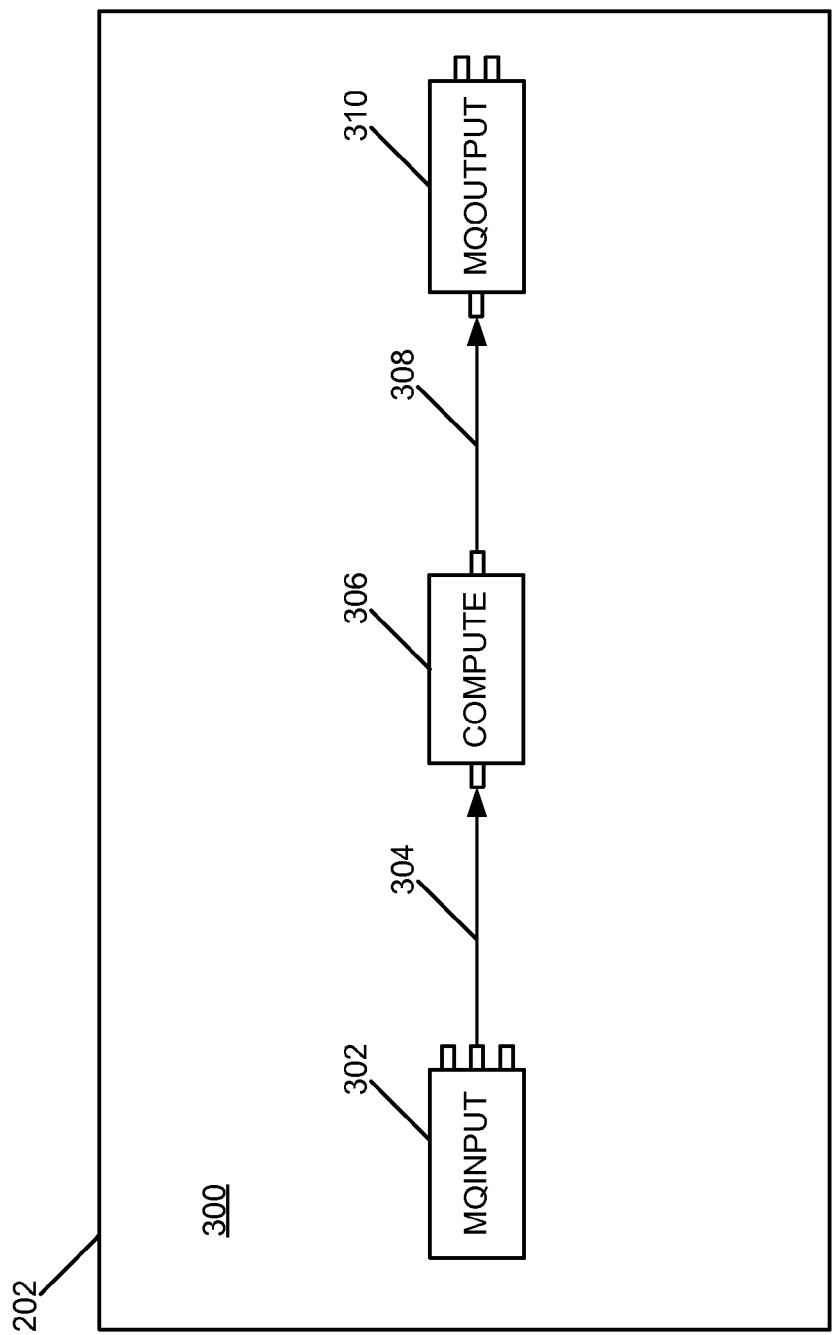
FIG. 3 is a flow diagram of an example of an implementation of a first graphical flow captured to represent a logical processing flow according to an embodiment of the present subject matter.

FIG. 3 is a flow diagram of an example of an implementation of a first graphical flow 300 captured to represent a logical processing flow. For purposes of the following examples, it is assumed that the computing device 102 is used to capture a graphical flow diagram and that the display 202 and input device 204 are used during this example processing. As such, the flow diagram 300 is illustrated on the display 202. Further, it is understood that any program for capturing a graphical from may be used to generate a graphical flow similar to the flow diagram 300, as appropriate, for use in association with the present subject matter.

An MQInput node 302 is shown connected via a connection 304 to a Compute node 306. The Compute node 306 is shown connected via a connection 308 to an MQOutput node 310. The MQInput node 302 may be considered a processing input node, while the Compute node 306 may be consider a processing node that processes input from the MQInput node 302 as appropriate for a given implementation. The MQOutput node 310 may be considered a processing output node that outputs processed information generated by the Compute node 306.

It is further assumed that two input sequences of the flow diagram 300 occurred resulting in two captured XML representations of the flow diagram 300. For example, a different input sequence of nodes may result either in response to input during different interactive sessions of graphical flow capture by a graphical flow designer or by flow capture in response to input by different graphical flow designers.

For purposes of the present example, it is assumed that the following first example XML pseudo code represents a first structured representation of the flow diagram 300 generated in response to a first of the two different input sequences of nodes.

```
< Definition>
   <MessageFlow uuid="41201051-2001-0000-0080- b3c2faada488">
      <ComIbmMQInputNode uuid="Flow1#FCMComposite_1_1" label="MQInput"
         queueName="IN" />
      <ComIbmComputeNode uuid="Flow1#FCMComposite_1_2" label="Compute" />
      <ComIbmMQOutputNode uuid="Flow1#FCMComposite_1_4" label="MQOutput"
         queueName="OUT" />
      <Connection sourceNode="Flow1#FCMComposite_1_1" sourceTerminal="out"
         targetNode="Flow1#FCMComposite_1_2" targetTerminal="in" />
      <Connection sourceNode="Flow1#FCMComposite_1_2" sourceTerminal="out"
         targetNode="Flow1#FCMComposite_1_4" targetTerminal="in" />
   </MessageFlow>
</Definition>
```

As can be seen from the first example XML pseudo code above, the MQInput node 302 is represented with the postfix "1_1" (e.g., "Flow1#FCMComposite_1_1" label="MQInput"). The Compute node 306 is represented with the postfix "1_2" and the MQOutput node 310 is represented with the postfix "1_4." Accordingly, for purposes of the first example XML pseudo code, it should be noted that it is assumed that designer input was detected that entered the MQInput node 302 followed by the Compute node 306, and that a third node was added and then deleted from the flow diagram 300 (resulting in a postfix "1_3" that was used and then removed from the flow diagram 300). The MQOutput node 310 was then added, resulting in the MQOutput node 310 being assigned the postfix "1_4." Terminal names are noted and may be utilized to retain terminal connection information for different terminal connections between nodes, as shown within FIG. 4 described below.

It can also be seen from the first example XML pseudo code above that input to create the connection 304 is shown to have been detected first (e.g., from Flow1#FCMComposite_1_1 that represents the MQInput node 302 to Flow1#FCMComposite_1_2 that represents the Compute node 306) followed by detected input to create the connection 308 (e.g., from Flow1#FCMComposite_1_2 that represents the Compute node 306 to Flow1#FCMComposite_1_4 that represents the MQOutput node 310).

The following second example XML pseudo code represents a second structured representation of the flow diagram 300 generated in response to a second of the two different input sequences of nodes.

that it is assumed that designer input was detected that entered the Compute node 306 followed by the MQOutput node 310, and that the MQInput node 302 was then added.

It can also be seen from the second example XML pseudo code above that input to create the connection 308 is shown to have been detected first (e.g., from Flow1#FCMComposite_1_1 that represents the Compute node 306 to Flow1#FCMComposite_1_2 that represents the MQOutput node 310) followed by detected input to create the connection 304 (e.g., from Flow1#FCMComposite_1_3 that represents the MQInput node 302 to Flow1#FCMComposite_1_1 that represents the Compute node 306).

As such, the first and second example XML pseudo code segments are different based upon input order and other processing differences for creation of the same flow diagram 300. Text comparison of the first and second example XML pseudo code segments may not determine that these pseudo code segments represent the same flow logic of the flow diagram 300. Complexity increases as the number of nodes increases.

Figure 4:
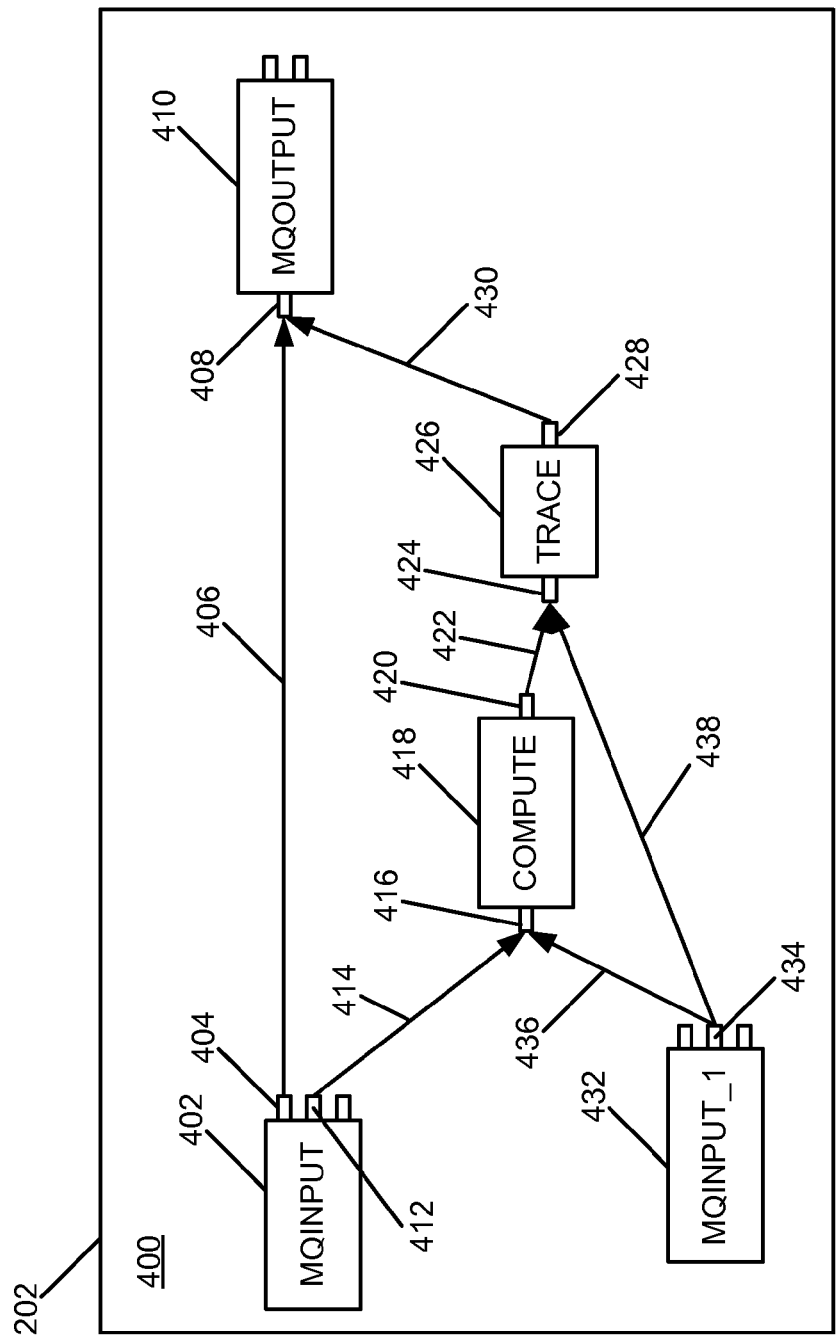
FIG. 4 is a flow diagram of an example of an implementation of a second graphical flow captured to represent a logical processing flow according to an embodiment of the present subject matter.

It should be noted that itemization of terminals associated with the respective components described above was omitted from the description of FIG. 3. However, the terminal interconnections are illustrated within the first example XML pseudo code and the second example XML pseudo code for clarity. FIG. 4 below provides a more complex example and distinguishes between certain terminals on the respective components within FIG. 4 and the description below.

FIG. 4 is a flow diagram of an example of an implementation of a second graphical flow 400 captured to represent

```
< Definition>
   <MessageFlow uuid="60201051-2001-0000-0080-b3c2faada488">
      <ComIbmComputeNode uuid="Flow1#FCMComposite_1_1" label="Compute" />
      <ComIbmMQOutputNode uid="Flow1#FCMComposite_1_2" label="MQOutput"
         queueName="OUT" />
      <ComIbmMQInputNode uuid="Flow1#FCMComposite_1_3" label="MQInput"
         queueName="IN" />
      <Connection sourceNode="Flow1#FCMComposite_1_1" sourceTerminal="out"
         targetNode="Flow1#FCMComposite_1_2" targetTerminal="in" />
      <Connection sourceNode="Flow1#FCMComposite_1_3" sourceTerminal="out"
         targetNode="Flow1#FCMComposite_1_1" targetTerminal="in" />
   </MessageFlow>
</Definition>
```

As can be seen from the second example XML pseudo code above, the Compute node 306 is represented with the postfix "1_1" (e.g., "Flow1#FCMComposite_1_1" label="Compute"). The MQOutput node 310 is represented with the postfix "1_2" and the MQInput node 302 is represented with the postfix "1_3." Accordingly, for purposes of the second example XML pseudo code, it should be noted a logical processing flow. As with FIG. 3 above, for purposes of the following examples, it is assumed that the computing device 102 is used to capture a graphical flow diagram and that the display 202 and input device 204 are used during this example processing. As such, the graphical flow 400 is also illustrated on the display 202. It is understood that any program for capturing a graphical flow may be used to generate a graphical flow similar to the graphical flow 400, as appropriate, for use in association with the present subject matter.

An MQInput node 402 is shown connected via an output terminal 404 and a connection 406 to an input terminal 408 of an MQOutput node 410. The MQInput node 402 is also shown connected via a different output terminal 412 and a connection 414 to an input terminal 416 of a Compute node 418. The Compute node 418 is shown connected via an output terminal 420 and a connection 422 to an input terminal 424 of a Trace node 426. The Trace node 426 is shown connected via an output terminal 428 and a connection 430 to the input terminal 408 of the MQOutput node 410. An MQInput_1 node 432 is shown connected via an output terminal 434 and a connection 436 to the input terminal 416 of the Compute node 418. The MQInput_1 node 432 is also shown connected via the same output terminal 434 and a connection 438 to the input terminal 424 of the Trace node 426.

The MQInput node 402 and the MQInput_1 node 432 may be considered processing input nodes, while the Compute node 418 may be considered a processing node that processes input from the MQInput node 402 and the MQInput_1 node 432 as appropriate for a given implementation. The Trace node 426 may be considered a node that provides tracing of information generated by the Compute node 418 and the MQInput_1 node 432. The MQOutput node 410 may be considered a processing output node that outputs processed information generated by the MQInput node 402 and the Trace node 426, again as appropriate for a given implementation.

The following two sections of pseudo code represent two versions of the graphical flow 400 captured either via different user interface tools or in response to different input sequences. As such, the following two sections of pseudo code are different and it is noted that text-based comparison may be difficult and time consuming, and that a determination of whether the two representations are identical or different may not result from a text-based comparison.

The following is the first section of pseudo code representing the graphical flow 400.

```
<Definition>
    <MessageFlow uuid="ffb4d555-2201-0000-0080-83b3cd941016">
        <ComIbmComputeNode uuid="MessageFlow2#FCMComposite_1_1"
        label="Compute" />
        <ComIbmTraceNode uuid="MessageFlow2#FCMComposite_1_2"
        label="Trace" /> <ComIbmMQInputNode
        uuid="MessageFlow2#FCMComposite_1_3" label="MQInput" />
        <ComIbmMQInputNode uuid="MessageFlow2#FCMComposite_1_4"
        label="MQInput1" />
        <ComIbmMQOutputNode uuid="MessageFlow2#FCMComposite_1_5"
        label="MQOutput" />
        <Connection sourceNode="MessageFlow2#FCMComposite_1_1"
        sourceTerminal="out" targetNode="MessageFlow2#FCMComposite_1_2"
        targetTerminal="in" />
        <Connection sourceNode="MessageFlow2#FCMComposite_1_2"
        sourceTerminal="out" targetNode="MessageFlow2#FCMComposite_1_5"
        targetTerminal="in" />
        <Connection sourceNode="MessageFlow2#FCMComposite_1_3"
        sourceTerminal="failure" targetNode="MessageFlow2#FCMComposite_1_5"
        targetTerminal="in" />
        <Connection sourceNode="MessageFlow2#FCMComposite_1_3"
        sourceTerminal="out" targetNode="MessageFlow2#FCMComposite_1_1"
        targetTerminal="in" />
        <Connection sourceNode="MessageFlow2#FCMComposite_1_4"
        sourceTerminal="out" targetNode="MessageFlow2#FCMComposite_1_1"
        targetTerminal="in" />
        <Connection sourceNode="MessageFlow2#FCMComposite_1_4"
        sourceTerminal="out" targetNode="MessageFlow2#FCMComposite_1_2"
        targetTerminal="in" />
    </MessageFlow>
</Definition>
```

The following is the second section of pseudo code representing the graphical flow 400.

```
<Definition>
    <MessageFlow uuid="0443c655-2201-0000-0080-83b3cd941016">
        <ComIbmMQInputNode uuid="MessageFlow1#FCMComposite_1_1"
        label="MQInput" />
        <ComIbmMQOutputNode uuid="MessageFlow1#FCMComposite_1_2"
        label="MQOutput" />
        <ComIbmTraceNode uuid="MessageFlow1#FCMComposite_1_3"
        label="Trace" />
        <ComIbmComputeNode uuid="MessageFlow1#FCMComposite_1_5"
        label="Compute" />
        <ComIbmMQInputNode uuid="MessageFlow1#FCMComposite_1_6"
        label="MQInput1" />
        <Connection sourceNode="MessageFlow1#FCMComposite_1_1"
        sourceTerminal="failure" targetNode="MessageFlow1#FCMComposite_1_2"
        targetTerminal="in" />
```

-continued

```
        <Connection sourceNode="MessageFlow1#FCMComposite_1_1"
        sourceTerminal="out" targetNode="MessageFlow1#FCMComposite_1_5"
        targetTerminal="in" />
        <Connection sourceNode="MessageFlow1#FCMComposite_1_3"
        sourceTerminal="out" targetNode="MessageFlow1#FCMComposite_1_2"
        targetTerminal="in" />
        <Connection sourceNode="MessageFlow1#FCMComposite_1_5"
        sourceTerminal="out" targetNode="MessageFlow1#FCMComposite_1_3"
        targetTerminal="in" />
        <Connection sourceNode="MessageFlow1#FCMComposite_1_6"
        sourceTerminal="out" targetNode="MessageFlow1#FCMComposite_1_3"
        targetTerminal="in" />
        <Connection sourceNode="MessageFlow1#FCMComposite_1_6"
        sourceTerminal="out" targetNode="MessageFlow1#FCMComposite_1_5"
        targetTerminal="in" />
    </MessageFlow>
</Definition>
```

As can be seen from the above first and second sections of pseudo code, certain labels are different between the two captured structural language representations. For purposes of the descriptions herein, translation and sorting of the first section of pseudo code is described. It is understood that similar processing for the second section of pseudo code may be performed in a similar manner.

The following enumeration tables represent a collection of numerical identifiers created for illustrating an example of the automated numerical graphical flow diagram conversion and comparison described herein. For purposes of the present example, the following enumerations may be referenced to WebSphere® Message Broker message flow. However, it is understood that a different set of enumeration tables may be implemented for any captured graphical flow generated by any graphical flow capture tool as appropriate for a given implementation. Table 1 through Table 4 illustrate node types and node identifiers (IDs), some of which are represented within FIG. 4. Table 5 and Table 6 illustrate node terminal identifiers (IDs).

The following Table 1 illustrates an example of node IDs that may be used to represent a "type" identifier for each node within a graphical flow, such as the graphical flow 400 of FIG. 4.

TABLE 1

Numerical Nodes Types

| No. | Type | ID (Max size: 1 byte) |
|---|---|---|
| 1 | Input Node | 1 |
| 2 | Processing Node | 2 |
| 3 | Output | 3 |

As can be seen from the example Table 1, three node types are identified and listed sequentially within Table 1. An "input node" type is defined and given a node ID of one (1). A "processing node" type is defined and given a node ID of two (2). An "output node" type is defined and given a node ID of three (3). As such, each of the nodes defined within the graphical flow 400 may be represented, as described in more detail below, with a numerical node type ID based upon whether the respective node is any input node, a processing node, or an output node as illustrated within Table 1.

The following Table 2 illustrates an example of numerical input node IDs that may be assigned to different types of input nodes.

TABLE 2

Numerical Input Node Identifiers (IDs) (Type Id: 1)

| No. | Name | ID (Max size: 1 byte) |
|---|---|---|
| 1 | MQInput | 1 |
| 2 | JMSInput | 2 |
| 3 | HttpInput | 3 |
| 4 | SOAPInput | 4 |
| 5 | SAPInput | 5 |
| 6 | Label | 6 |
| 7 | FileInput | 7 |
| 8 | TCPIPInput | 8 |
| 9 | Timeout Notification | 9 |
| 10 | ScadaInput | 10 |
| 11 | RealTime Input | 11 |

As can be seen from Table 2, each available example input node type is sequentially listed and a numerical value is assigned as a numerical identifier for each node type.

The following Table 3 illustrates an example of numerical processing node IDs that may be assigned to different types of processing nodes.

TABLE 3

Numerical Processing Node Identifiers (IDs) (Type Id: 2)

| No. | Name | ID (Max size: 1 byte) |
|---|---|---|
| 1 | MQReply | 1 |
| 2 | MQGet | 2 |
| 3 | JMSReply | 3 |
| 4 | JMSTransform | 4 |
| 5 | HttpRequest | 5 |
| 6 | HttpReply | 6 |
| 7 | SOAPRequest | 7 |
| 8 | SOAPReply | 8 |
| 9 | SAPRequest | 9 |
| 10 | Filter | 10 |
| 11 | Publication | 11 |
| 12 | Route | 12 |
| 13 | Collector | 13 |
| 14 | Compute | 14 |
| 15 | XSL Transformation | 15 |
| 16 | Throw | 16 |
| 17 | Trace | 17 |
| 18 | Passthru | 18 |
| 19 | FLowOrder | 19 |
| 20 | Database | 20 |
| 21 | TCPIPReceive | 21 |
| 22 | Timeout Control | 22 |
| 23 | Validate | 23 |
| 24 | AggregateReply | 24 |

As can be seen from Table 3, each available processing node type is sequentially listed and defined to have a numerical identifier.

The following Table 4 illustrates an example of numerical output node IDs that may be assigned to different types of output nodes.

TABLE 4

Numerical Output Node Identifiers (ID) (Type Id: 3)

| No. | Name | ID (Max size: 1 byte) |
|---|---|---|
| 1 | MQOutput | 1 |
| 2 | JMSOutput | 2 |
| 3 | EmailOutput | 3 |
| 4 | Scada output | 4 |
| 5 | FileOutput | 5 |
| 6 | TCPIPOutput | 6 |

As can be seen from Table 4, each available output node type is sequentially listed and defined with a numerical identifier.

The following Table 5 illustrates an example of numerical input terminal identifiers.

TABLE 5

Numerical Input Terminals Identifiers (IDs)

| No. | Name | ID (Max size: 1 byte) |
|---|---|---|
| 1 | In | 1 |
| 2 | Control | 2 |
| 3 | Finish | 3 |
| 4 | Close | 4 |

As can be seen from Table 5, each available terminal type is sequentially listed and defined with a numerical identifier.

The following Table 6 illustrates an example of numerical output terminal identifiers.

TABLE 6

Numerical Output Terminal Identifiers (IDs)

| No. | Name | ID (Max size: 1 byte) |
|---|---|---|
| 1 | Out | 1 |
| 2 | out1 | 2 |
| 3 | out2 | 3 |
| 4 | out3 | 4 |
| 5 | out4 | 5 |
| 6 | catch | 6 |
| 7 | failure | 7 |
| 8 | endofdata | 8 |
| 9 | close | 9 |
| 10 | nomessage | 10 |
| 11 | fault | 11 |
| 12 | true | 12 |
| 13 | false | 13 |
| 14 | unknown | 14 |
| 15 | match | 15 |
| 16 | default | 16 |
| 17 | first | 17 |
| 18 | second | 18 |

As can be seen from Table 6, each available output terminal type is sequentially listed and defined to have a numerical identifier.

The identifiers represented above in Table 1 through Table 6 will now be utilized within an example of the automated numerical graphical flow diagram conversion and comparison. It is understood that different node and terminal types may be represented within different graphical flow tools and that different numerical identifier tables may be utilized as appropriate for a given implementation. As such, the following example provides one detailed example based upon the graphical flow 400 of FIG. 4 utilizing the numerical identifiers defined within Table 1 through Table 6 above.

Figure 5:
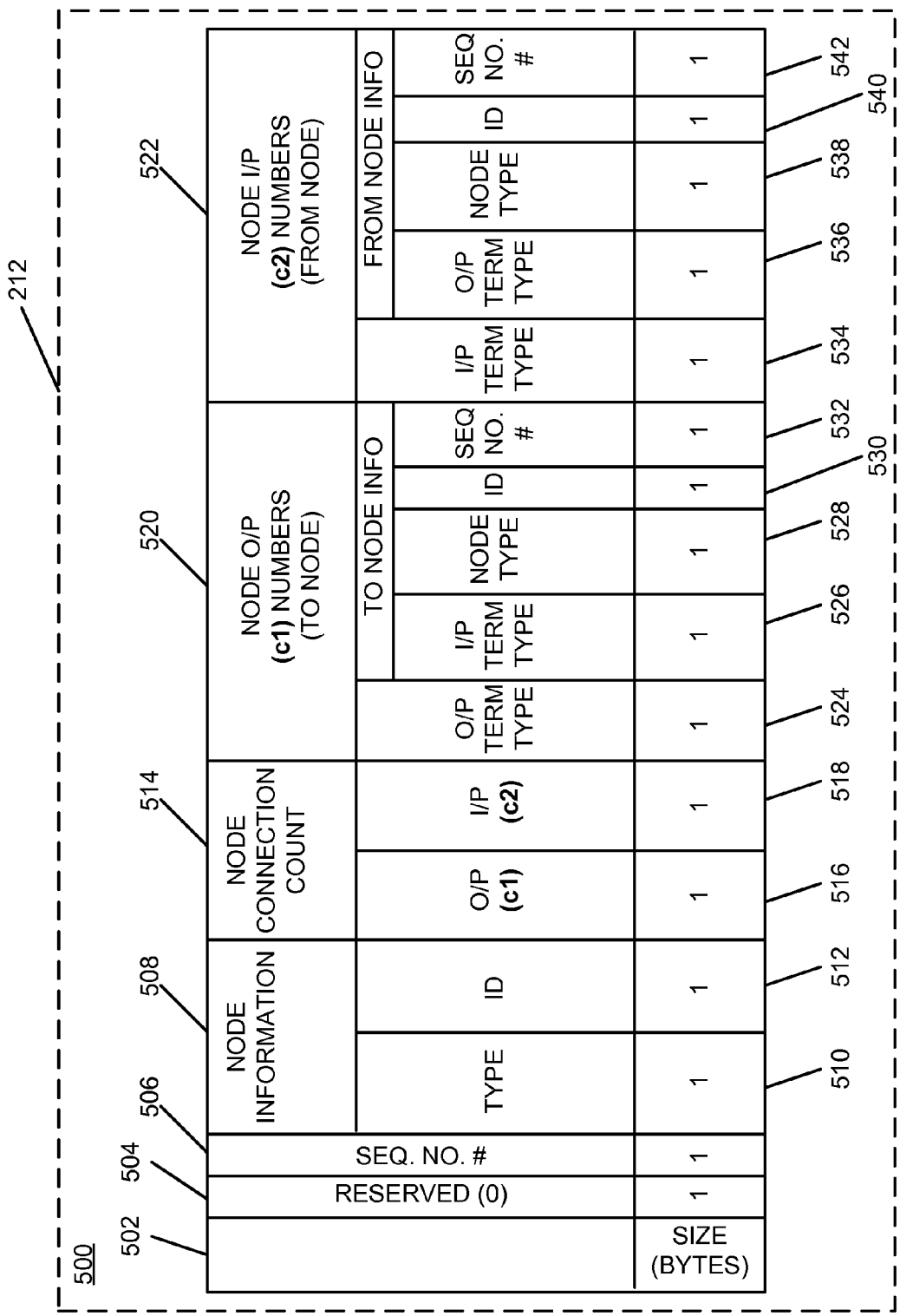
FIG. 5 is a diagram of an example of an implementation of an element information structure (EIS) including a data structure format that may be used to implement the automated numerical graphical flow diagram conversion and comparison according to an embodiment of the present subject matter.

FIG. 5 is a diagram of an example of an implementation of an element information structure (EIS) 500 including a data structure format that may be used to implement the automated numerical graphical flow diagram conversion and comparison described herein. As can be seen from FIG. 5, the EIS 500 is shown within the numerical flow information storage area 212 of the memory 208.

The basic structural element of the data patterns utilized for the automated numerical graphical flow diagram conversion and comparison is the EIS 500. The EIS 500 includes all numerical data for all elements associated with a single node of a graphical flow. As will be described in more detail below, multiple element information structures may be used to represent, sort, and sequence nodes to form a common representation that may be utilized for numerical comparison of graphical flows to determine whether they are identical or not. In a message flow, such as the graphical flow 400, there may be multiple nodes (e.g., XML elements as captured). Each of these nodes may be represented as an EIS instance. The various attributes and interconnections of the nodes have a numerical representation as described within the enumeration tables of Table 1 through Table 6 in the following sections of this document.

The EIS 500 can represent all node forms (e.g., Input node types, Processing node types, and Output node types, based upon the product chosen for capturing a graphical logic flow) in a single structure definition.

A size field 502 may represent a size for the respective EIS generated based upon the EIS 500. An example size may include, with byte sized fields, six (6) bytes plus five (5) bytes for each connection, as described in more detail below. Equation 1 illustrates an example equation to determine a size of the respective EIS that is generated for each node based upon the EIS 500.

$$\text{Size} = 6 \text{ bytes} + ((c1+c2)*5 \text{ bytes} \qquad \text{Equation (1)}$$

A reserved field 504 may include a byte-width field that is reserved for future uses. A sequence number field 506 may also include a byte-width field that may used as described in more detail below when multiple element information structures are sequenced. As such, the sequence number for any given EIS is generated after applying sorting to an array of nodes represented in EIS format. A node information field 508 includes node type field 510 and a node ID field 512, each, for example, represented with a byte-width parameter. The node type value may be selected as defined within Table 1 above for the node type. The node ID field may be populated based upon the definitions provided within Table 2 through Table 4. A node connection count field 514 includes an output (O/P) count (C1) field 516 and an input (I/P) count (C2) field 518. The output count field 516 and the input count field 518 will be populated based upon the number of output and input connections, respectively, for each node within a flow graph, such as the graphical flow 400.

Based upon the number of output connections and input connections for a given node, a variable number of output connection fields and input connection fields will be represented within a given EIS that is generated based upon the EIS 500. The EIS 500 illustrates an example format for each such set of fields for a single output and input connection. As such, the EIS 500 includes an output (O/P) connection field 520 and an input (I/P) connection field 522. Again, it is understood that each of the output (O/P) connection field 520 and the input (I/P) connection field 522 may be generated once for each such respective output or input connection for a given node for which an EIS is created. As described above, each connection field may include five bytes of information for each such connection.

Regarding the output (O/P) connection field 520, an output (O/P) terminal type field 524 may be populated based upon the identifiers defined in association with Table 6 above. The output (O/P) connection field 520 includes a collection of four fields that represent "to node" information and include an input (I/P) terminal type field 526, a node type field 528, an ID field 530, and a sequence number field 532. Each of the input terminal type field 526, the node type field 528, and the ID field 530 may be populated, as described in more detail below, and associated to array processing of multiple EIS structures based upon connection information for the output terminal represented within the output terminal type field 524, for the given output (O/P) connection field 520, and the respective EIS. As with the sequence number of the sequence number field 506, the sequence number within the sequence number field 532 will be filled in association with sorting of the array of the EIS structures, as described in more detail below.

Regarding the input (I/P) connection field 522, an input (I/P) terminal type field 534 may be populated based upon the identifiers defined in association with Table 5 above. The input (I/P) connection field 522 includes a collection of four fields that represent "from node" information and include an output (O/P) terminal type field 536, a node type field 538, an ID field 540, and a sequence number field 542. Each of the output terminal type field 536, the node type field 538, and the ID field 540 may be populated, as described in more detail below, and associated to array processing of multiple EIS structures based upon connection information for the input terminal represented within the input terminal type field 534, for the given input (I/P) connection field 522, and the respective EIS. As with the sequence number of the sequence number field 506, the sequence number within the sequence number field 542 will be filled in association with sorting of the array of the EIS structures, as described in more detail below.

As described in more detail below, the element information structures generated for a given graphical flow may be sorted in ascending order and placed in an array. The sorting mechanism automatically groups Input, Processing, and Output type of nodes in the array. The sorted EIS arrays may be compared to find identical message flows.

Figures 6, 7:
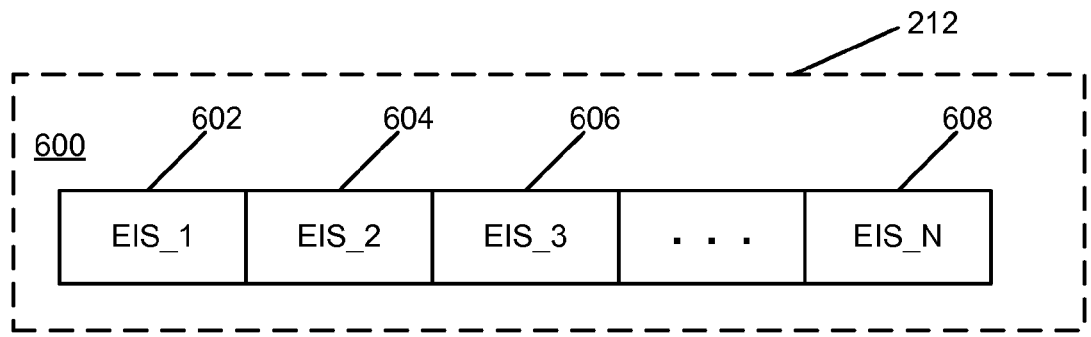
FIG. 6 is a diagram of an example of an implementation of an EIS array of a collection of EIS structures in a generic format according to an embodiment of the present subject matter.
FIG. 7 is an illustration of an example of an implementation of a sort key table that provides a set of sort keys to be applied in varying sequences for processing EIS structures in association with the automated numerical graphical flow diagram conversion and comparison according to an embodiment of the present subject matter.

FIG. 6 is a diagram of an example of an implementation of an EIS array 600 of a collection of EIS structures in a generic format. As shown generally within FIG. 6, an EIS_1 602, an EIS_2 604, an EIS_3 606, through an EIS_N 608 are illustrated. Specific example EIS structures associated with graphical flow 400 of FIG. 4 are described beginning with FIG. 8 below.

FIG. 7 is an illustration of an example of an implementation of a sort key table 700 that provides a set of sort keys to be applied in varying sequences for processing EIS structures in association with the automated numerical graphical flow diagram conversion and comparison described herein. The sort keys may be applied, as described in more detail below, in varying sequences at various stages of processing. As such, the listing of sort keys within FIG. 7 is for ease of reference, but does not indicate the respective order of sort key application to EIS structures or EIS arrays.

As such, a first sort key (SK 1) 702 shows that one sort applied to an EIS array, such as the EIS array 600, may be based upon node information, specifically node type. A second sort key (SK 2) 704 represents an additional sort may that may be performed on node information, specifically a node ID. A third sort key (SK 3) 706 represents a sort that may be performed based upon a connection count. A fourth sort key (SK 4) 708 represents a sort that may be performed based upon an output (O/P) terminal type. A fifth sort key (SK 5) 710 represents a sort that may be performed based upon a "to node" input (I/P) terminal type. A sixth sort key (SK 6) 712 represents a sort that may be performed on a "to node" type. A seventh sort key (SK 7) 714 represents a sort that may be performed on a "to node" ID. An eighth sort key (SK 8) 716 represents a sort that may be performed based upon a "to node" sequence number that may be used in Step 5 described below. A ninth sort key (SK 9) 718 represents a sort that may be performed based upon an input (I/P) terminal type. A tenth sort key (SK 10) 720 represents a sort that may be performed based upon a "from node" output (O/P) terminal type. An eleventh sort key (SK 11) 722 represents a sort that may be performed on a "from node" type. A twelfth sort key (SK 12) 724 represents a sort that may be performed on a "from node" ID. A thirteenth sort key (SK 13) 726 represents a sort that may be performed based upon a "from node" sequence number that may be used in Step 5 described below.

As described in more detail below, if a given sort key results in ambiguity, then the next sort key is applied until the ambiguity is resolved or a determination is made that a particular sequence of numeric values are identical. As such, if all of the sort keys are ambiguous, then the nodes will be identical. If a "to node" field (SK 4 708 through SK 8 716) is absent from a given EIS, then the sorting may be performed using "from node" data (SK 9 718 through SK 13 726). The EIS with absent "to nodes" may be placed below those with "to node" data in the same group. For example, the processing nodes with "to node" data present may precede those nodes without "to node" data. The EIS with both "to nodes" and "from nodes" present may be placed at the top of that particular group. Processing of the automated numerical graphical flow diagram conversion and comparison using the above-described sort keys will be described in more detail below.

Figure 8:
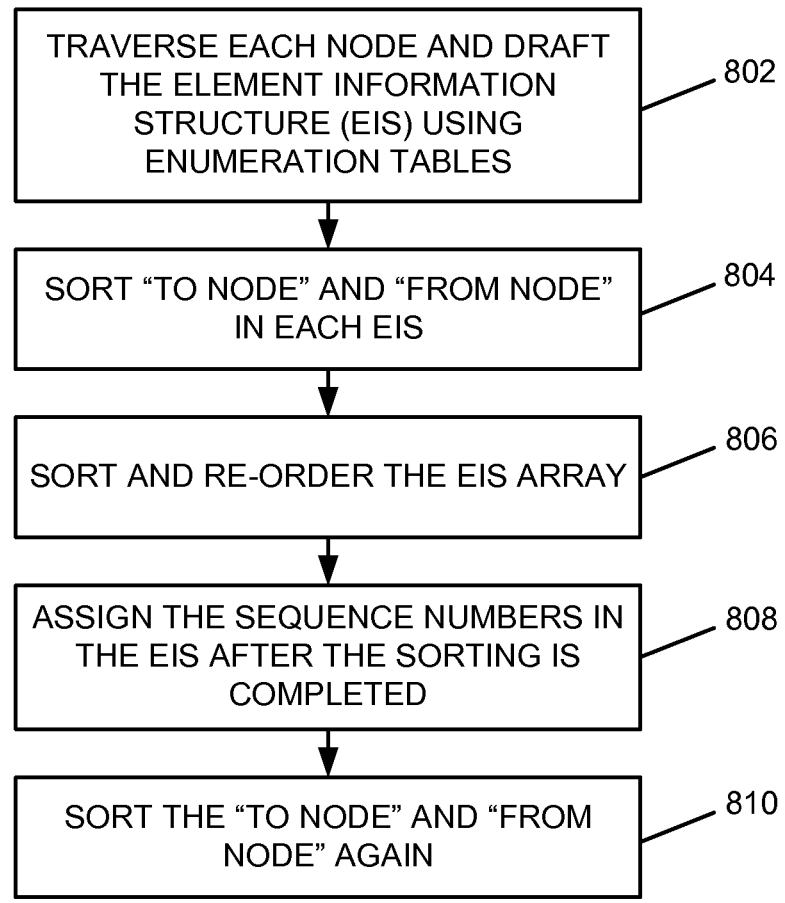
FIG. 8 is a flow chart of an example of an implementation of a process for automated numerical graphical flow diagram conversion and comparison according to an embodiment of the present subject matter.

FIG. 8 is a flow chart of an example of an implementation of a process 800 for automated numerical graphical flow diagram conversion and comparison. At block 802, the process 800 traverses each node and drafts the element information structure (EIS) using enumeration tables. At block 804, the process 800 sorts the "To Node" and the "From Node" in each EIS. At block 806, the process 800 sorts and re-orders the EIS array. At block 808, the process 800 assigns the sequence numbers in the EIS after the sorting is completed. At block 810, the process 800 sorts the "To Node" and "From Node" again.

Figure 15:
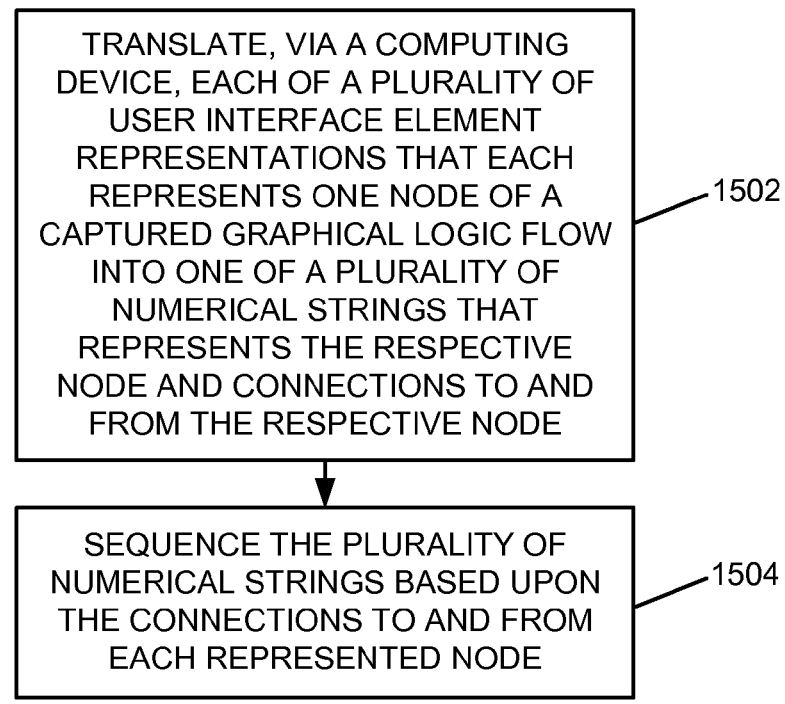
FIG. 15 is a flow chart of an example of an implementation of a process for automated numerical graphical flow diagram conversion according to an embodiment of the present subject matter.
Figure 16:
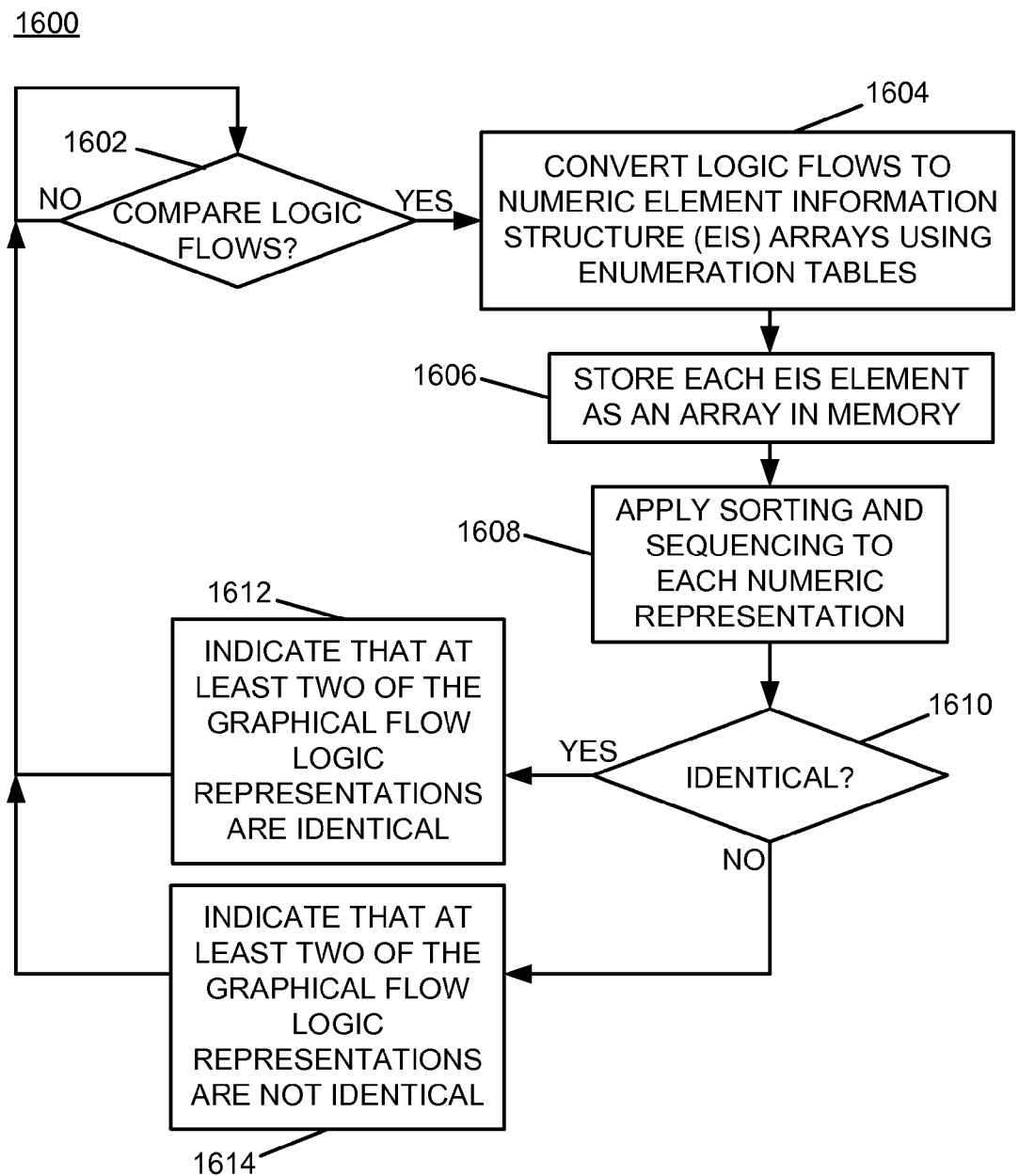
FIG. 16 is a flow chart of an example of an implementation of a process for automated numerical graphical flow diagram conversion and comparison according to an embodiment of the present subject matter.

FIG. 9 through FIG. 14 described below represent a detailed example of automated numerical graphical flow diagram conversion based upon the graphical flow 400 of FIG. 4. It is understood that this processing may be performed, for example, by the numerical flow processing module 214 described above in association with FIG. 2. FIG. 15 represents an example process that may be performed, for example, by the numerical flow processing module 214, for translating and sequencing a graphical flow diagram. FIG. 16 represents an example process that may be performed, for example, by the numerical flow processing module 214, for comparison of two or more numerical representations of graphical flow diagrams to determine whether they are different or represent identical flow logic, where each numerical representation was translated and sorted as described in association with FIG. 15.

Figure 9:
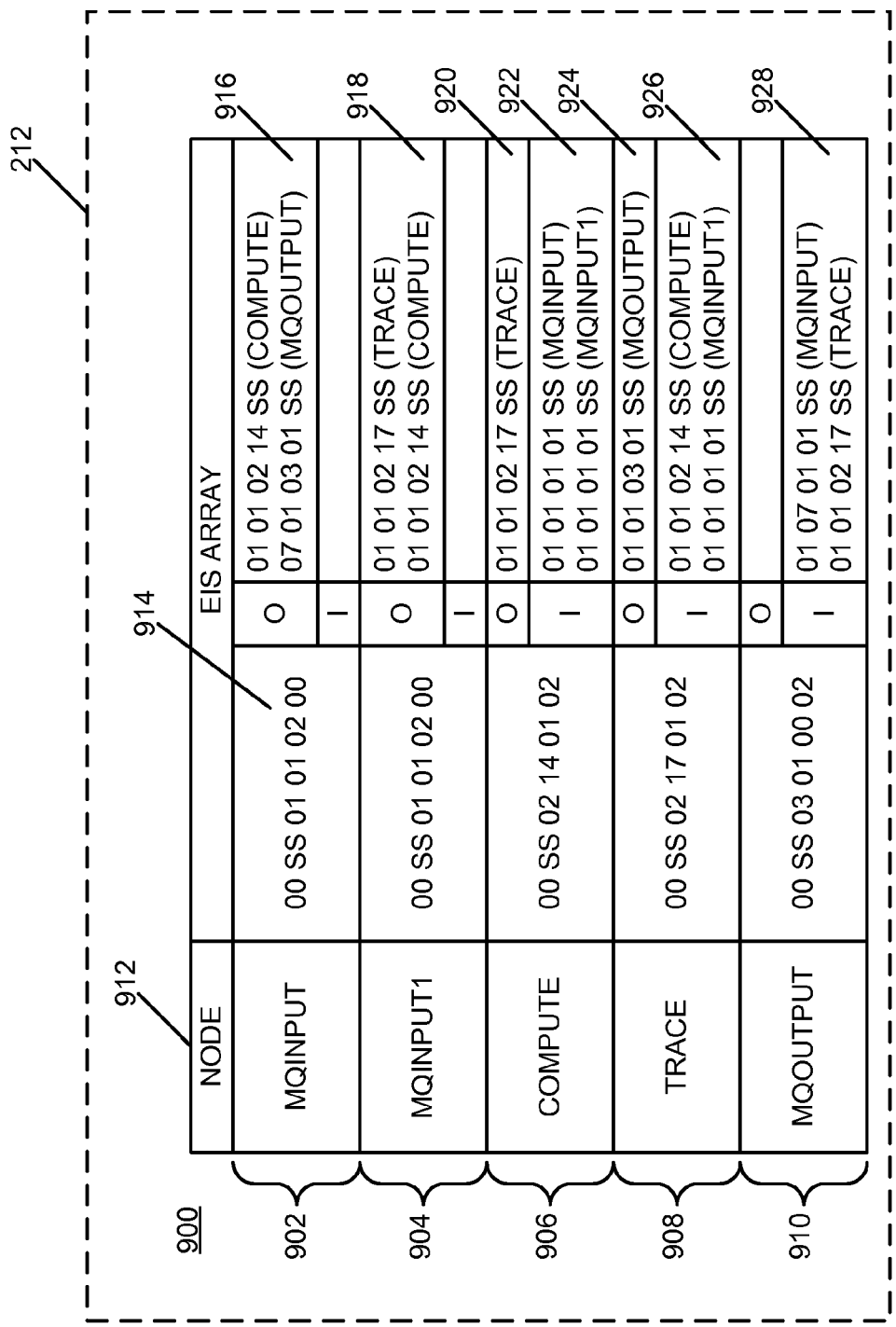
FIG. 9 is a diagram of an example of an implementation of an EIS array based upon the graphical flow of FIG. 4 that represents a translation of node information for a structured language representation into numeric format using the enumeration Table 1 through the enumeration Table 6 according to an embodiment of the present subject matter.

FIG. 9 is a diagram of an example of an implementation of an EIS array 900 based upon the graphical flow 400 of FIG. 4 that represents a translation of node information for a structured language representation, such as the example first section of pseudo code shown above, of the graphical flow 400 into numeric format using the enumeration Table 1 through the enumeration Table 6. An EIS 902 provides a numerical representation for the MQInput node 402 of FIG. 4. Similarly, an EIS 904 provides a numerical representation of the MSInput_1 node 432. An EIS 906 provides a numerical representation of the Compute node 418. An EIS 908 provides a numerical representation of the Trace node 426. An EIS 910 provides a numerical representation of the MSOutput node 410. As such, the EIS array 900 includes an EIS for each node represented within the graphical flow 400 and the example first section of pseudo code shown above.

It should be noted that the size field 502 of the EIS 500 described in association with FIG. 5 is omitted from each EIS within the EIS array 900 for brevity. However, it is understood that a size field may be included as appropriate for a given implementation, though the sorting described herein is based upon the content of the respective fields of the EIS structures that represent the respective nodes.

Each of the EIS 902 through the EIS 910 were generated by traversing each node within the graphical flow 400 as represented in the example first section of pseudo code and generating the respective EIS using the enumeration tables of Table 1 through Table 6 described above. The EIS 902 will be described in detail with reference to the EIS 500 described above. A node column 912 is provided to facilitate a description of the present EIS array 900. However, it is understood that the appropriate information for sorting is encoded numerically within each respective EIS of the EIS array 900, as described in more detail below.

A node information field 914 provides numerically-formatted information associated with the MQInput node 402 represented within the EIS 902. From left to right, the numerical pairs represent byte-width fields as described in association with the EIS 500 of FIG. 5. Reference may be made to FIG. 5 for a description of the respective fields described below. All values are represented in decimal format within an eight bit (e.g., byte-width) field within the examples for ease of description purposes. However, it is understood that binary, octal, hexadecimal or other encoding may be used as appropriate for a given implementation.

The node information field 914 includes an array of (00 SS 01 01 02 00). As such, within the node information field 914, the first pair of numerals are zeros (00) and represent numerical content for the reserved field 504. The reserved field 504 is defaulted to zeros for all EIS structures in the EIS array 900. The second pair of characters are "S" characters (SS) and represent a lack of assigned numerical content for the sequence number field 506. The pair of "S" characters show that the sequence number for the EIS 902 (and all other EIS structures within the EIS array 900) have not yet been assigned, as described above. Assignment of the sequence numbers for the respective EIS elements of the EIS array 900 will be described in detail below.

The third pair of numerals of the node information field 914 are a zero and a one (01) and represent numerical content for the node information type 510. With reference to Table 1 above, the MQInput node 402 is an input node with a defined numerical identifier (ID) of one (1), expanded to eight bits within the present example. As such, the zero and the one (01) within the third pair of numerals of the node information field 914 show that the MQInput node 402 is a node of type "Input Node."

The fourth pair of numerals of the node information field 914 are also a zero and a one (01) and represent numerical content for the node identifier (ID) field 512. With reference to Table 2 above, the type for the MQInput node 402 is "MQInput" with a defined numerical identifier (ID) of one (1), expanded to eight bits. As such, the zero and the one (01) within the fourth pair of numerals of the node information field 914 show the node ID of the MQInput node 402.

The fifth pair of numerals of the node information field 914 are a zero and a two (02) and represent numerical content for the output (O/P) connection count field 516. With reference to FIG. 4, the MQInput node 402 is connected to each of the MQOutput node 410 and the Compute node 418. As such, the output node count is two (02), as represented and expanded to eight bits within the present example.

The sixth pair of numerals of the node information field 914 are a zero and a zero (00) and represent numerical content for the input (I/P) connection count field 518. With reference to FIG. 4, the MQInput node 402 has no input connections. As such, the input node count is zero (00), as represented and expanded to eight bits within the present example.

Regarding numerical representations for the output and input connections of any given node within an EIS of the EIS array 900, the output (O/P) connection field 520 and the input (I/P) connection field 522 are represented. It should be noted that each of the output (O/P) connection field 520 and the input (I/P) connection field 522 are populated as appropriate for each represented node and its respective connections. It is further noted, that as described above, within the present example, each input or output connection may be represented with a five (5) byte field. However, it is understood that different representations and formats may be used as appropriate for a given implementation.

Regarding the EIS 902, the output (O/P) connection field 520 includes output content 916 (shown within FIG. 9 with a field beginning with the capital letter "O") that represents the two output connections shown and described in association with FIG. 4 above. Because there are no input connections to the MQInput node 402, the input (I/P) connection field 522 is empty (as shown within FIG. 9 with a field beginning with the capital letter "I" without any input content shown).

The output content 916 includes two rows of numeric content. The first (e.g., top) row represents a connection to the Compute node 418 and the second row represents a connection to the MQOutput node 410. The labels "Compute" and "MQOutput" are provided for ease of description of the present example. However, it is understood that these labels, along with the identifiers within the node column 912 and the capital letters "O" and "I" that help delineate the respective fields within the present examples do not form numerical content and are all provided for ease of description of the present example.

The first (e.g., top) row of numeric content within the output content 916 associated with the Compute node 418 includes an array of (01 01 02 14 SS). With reference to the EIS 500 of FIG. 5 and the first row of numeric content within the output content 916 associated with the Compute node 418, the first pair of numerals are a zero and a one (01) and represent numerical content for the output (O/P) terminal type field 524. With reference to Table 6 above for output terminal types, it can be seen that the type of the output terminal 404 of the MQInput node 402 is type "Out."

The second pair of numerals of the first row of numeric content within the output content 916 are also a zero and a one (01) and represent numerical content for the "to node" input (I/P) terminal type field 526. With reference to Table 5 above for input terminal types, it can be seen that the type of the input terminal 416 of the Compute node 418 is type "In."

The third pair of numerals of the first row of numeric content within the output content 916 are a zero and a two (02) and represent numerical content for the "to node" node type field 528. With reference to Table 1 above for node types, it can be seen that the type of the Compute node 418 is a processing node, defined as node type two (02), expanded to an eight bit field within the present example.

The fourth pair of numerals of the first row of numeric content within the output content 916 are a one and a four (14) and represent numerical content for the "to node" node identifier (ID) field 530. With reference to Table 3 above for processing node identifiers (IDs), it can be seen that the node ID of the Compute node 418 is defined as fourteen (14), expanded to an eight bit field, again in decimal format to ease description of the present subject matter.

The fifth pair of characters of the first row of numeric content within the output content 916 are "S" characters (SS) and represent a lack of assigned numerical content for the "to node" sequence number field 532. The pair of "S" characters show that the sequence number for the "to node" associated with the first row of the output (O/P) connection field 520 of the EIS 902 (and all other EIS structure connections within each EIS of the EIS array 900) have not yet been assigned, as described above. Assignment of the sequence numbers will be described in detail below.

Similar analysis may be performed for the second (e.g., bottom) row of numeric content within the output content 916 to identify how the respective fields are populated based upon the enumeration Table 1 through the enumeration Table 6. Based upon the description above of the assignment of numerical values for each of the fields described above in association with the EIS 902, it is understood that a person of skill will be able to utilize the enumeration tables (Table 1 through Table 6) described above to determine how the values shown within the remaining row of the output (O/P) connection field 520 of the EIS 902 were assigned, as well as each other numerical content represented within the EIS array 900. As such, this detail is omitted herein for brevity.

It is further understood that the sequence of the EIS 902 through the EIS 910 may be randomly placed during the initial analysis based upon processing of the input structured language document, such as for example an XML document that is encoded with node and connection information for a graphical flow, such as the graphical flow 400. As such, the processing shown within FIG. 9 shows transformation of every node and each connection of the graphical flow 400 into a numerical representation, where the graphical flow 400 has been converted into numbers (e.g., numerical sequences/arrays). As such, from this point forward, numbers are used in association with the automated numerical graphical flow diagram conversion and comparison described herein.

It is additionally understood that the processing described below sequences the respective EIS structures and fills in the sequence numbers, based upon the converted/generated numerical content to provide a source structured-language encoding-independent approach to comparing multiple graphical flow diagrams to determine whether the multiple graphical flow diagrams are identical or are different. Comparison of converted graphical flow diagrams will be described in more detail below beginning with FIG. 16.

As such, for the present stage of processing, it is sufficient to capture a numerical representation of each node within the graphical flow 400 within a separate EIS structure and to form the EIS array 900. Additional processing to sort and assign sequence numbers to the various elements of the EIS 902 through the EIS 910 will be described below beginning with FIG. 10.

It is noted that the output (O/P) connection field 520 of the EIS 904 includes output content 918, the output (O/P) connection field 520 of the EIS 906 includes output content 920, the input (I/P) connection field 522 of the EIS 906 includes input content 922, the output (O/P) connection field 520 of the EIS 908 includes output content 924, the input (I/P) connection field 522 of the EIS 908 includes input content 926, and the input (I/P) connection field 522 of the EIS 910 includes input content 928. Fields within the respective EIS structures that are blank (i.e., that do not include arrays) show that a respective connection does not exist within the graphical flow 400, as described above.

For purposes of the sorting described herein, it should be noted that sorting of the respective fields of each EIS structure may be performed on a left-to-right analysis of the respective array fields. This sorting is based upon a first noted element (again left to right) of a first numerical array of each EIS structure section (e.g., input or output content) that is noted to have a first array element (e.g., numerical pair) that is greater than a respective array element of a second or subsequent numerical array among which the respective numerical arrays are to be sorted. It is further noted that the next phase of sorting is directed to sorting based upon the "to node" and "from node" areas of the respective EIS structures (i.e., the output (O/P) connection field 520 and the input (I/P) connection field 522, again excluding the sequence number fields 532 and 542 at this stage of processing). It is understood that the output (O/P) connection field 520 areas of the respective EIS structures constitute the fields 524 through 530 as described in association with FIG. 5. Additionally, the input (I/P) connection field 522 areas of the respective EIS structures constitute the fields 534 through 540 as also described in association with FIG. 5. Further, with reference to FIG. 7 above, the sort keys SK4 through SK7 are used to sort the output (O/P) connection field 520 and the sort keys SK9 through SK12 are used to sort the input (I/P) connection field 522 at this stage of sort processing. As such, it should be noted that this stage of sorting is not concerned with sorting with respect to other nodes, but is sorting within the respective EIS structures. Sorting between the respective nodes will be described in more detail below.

For example, the output content 916 includes a first array for the Compute node 418 of (01 01 02 14), excluding the sequence number field 532 since it is not filled in yet. The output content 916 also includes a numerical array for the MQOutput node 410 of (07 01 03 01), again excluding the sequence number field 532 since it is not filled in yet.

Because the first element (numerical pair) of each of the output (O/P) connection field 520 of the numerical arrays are already sequenced in increasing order (e.g., 07 of the second array is greater than 01 of the first array), processing for the output (O/P) connection field 520 at this stage of processing yields no change because a left-to-right analysis of the arrays shows that they are already ordered in increasing order with the first elements identified having been placed initially in increasing numerical order. Accordingly, these numerical arrays may be considered as already ordered within the output content 916 based upon the sorting of the present subject matter and no further analysis of the respective numerical arrays of the output content 916 is performed at this sorting phase. This is also true for each of the output content 920, the input content 922, and the output content 924. As such, these respective content fields may be considered to already be sorted in numerically-increasing order as captured from the example first portion of pseudo code shown above and used to generate the EIS structures.

However, the output content 918, the input content 926, and the input content 928 may be sorted. As can be seen from FIG. 9, the output content 918 includes a numerical array for the Trace node 426 of (01 01 02 17), again excluding the sequence number field 532 since it is not filled in yet. The output content 918 also includes a numerical array for the Compute node 418 of (01 01 02 14), again excluding the sequence number field 532 since it is not filled in yet. As can be seen from these portions of the respective numerical arrays, each of the first three elements (numerical pairs) are identical, but the fourth element is not sequenced within increasing numerical order. The element (17) of the numerical array for the Trace node 426 is greater than the element (14) of the numerical array for the Compute node 418. (e.g., the element 14 of the second numerical array is not greater than the element 17 of the first numerical array). Accordingly, the fourth element of this portion of the numerical arrays is the first element within the respective array pairs to indicate that the respective arrays are to be sorted because they are not identical and are not already placed in increasing numerical order as captured from the XML used to create the EIS 904. As such, for purposes of the present subject matter these two numerical arrays may be reordered within the EIS 904 by the sorting described in more detail below to place the numerical arrays in increasing numerical order. A similar analysis applies to the input content 926 and the input content 928, and the sorted numerical arrays are shown reordered within FIG. 10 as described below.

Figure 10:
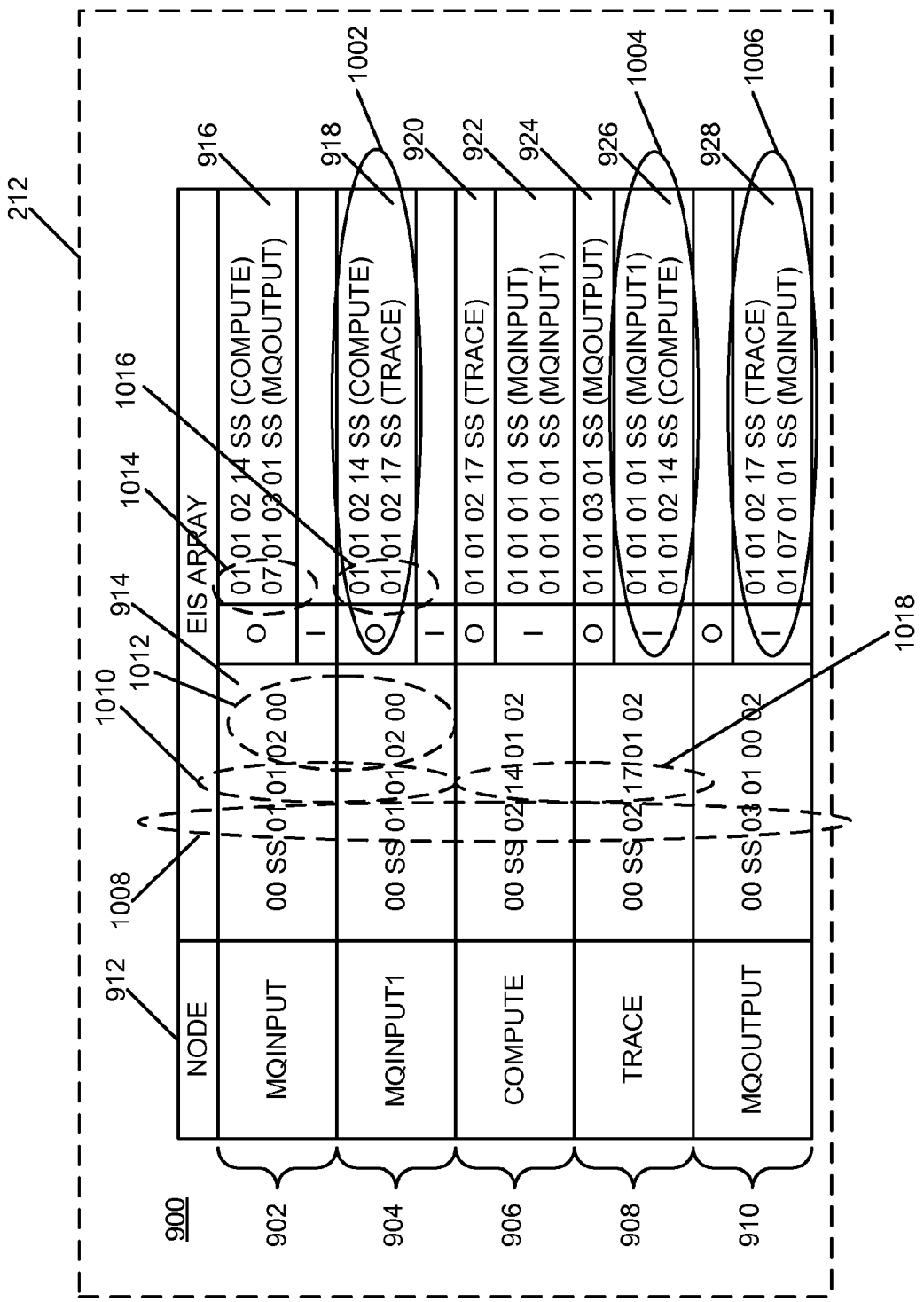
FIG. 10 is a diagram of an example of an implementation of the EIS array of FIG. 9 sorted based upon the "to node" and the "from node" sort within each EIS structure according to an embodiment of the present subject matter.

FIG. 10 is a diagram of an example of an implementation of the EIS array 900 of FIG. 9 sorted based upon the "to node" and the "from node" sort within each EIS structure 902 through 910. As described above, the "to node" areas of the respective EIS structures constitute the fields 524 through 530 that form the output (O/P) connection field 520 as described in association with FIG. 5. Additionally, the "from node" areas of the respective EIS structures constitute the fields 534 through 540 that form the input (I/P) connection field 522 as also described in association with FIG. 5.

The enclosed circle 1002, the enclosed circle 1004, and the enclosed circle 1006 show the three areas of the EIS array 900 that have been changed due to the sorting based upon the "to node" and the "from node" fields of each EIS array. As can be seen from FIG. 10, the enclosed circle 1002 shows that the numerical arrays associated with the Compute node 418 of (01 01 02 14) and the Trace node 426 of (01 01 02 17) have been reordered (e.g., swapped) within the EIS 904. As described above, this reordering is based upon a left-to-right sort of the "to node" and the "from node" areas of each EIS array. Within the EIS array 904, the element (17) of the numerical array for the "to node" (e.g., node ID field 530) information of the Trace node 426 is greater than the element (14) of the numerical array for the "to node" (e.g., node ID field 530) information of the Compute node 418. Otherwise, the numerical arrays with the output (O/P) connection fields 520 are identical. As such, the numerical array for the Compute node 418 has been reordered via the sorting process at this stage to be the first numerical array within the output content 918.

Similar sort processing on the "to node" and "from node" areas of the respective EIS structures has been performed on each EIS output and input content area as described above, and the numerical arrays within the input content 926 and the input content 928 have also been reordered. As can be seen from FIG. 10, the enclosed circle 1004 shows that the numerical arrays associated with the MQInput1 node 432 of (01 01 01 01) and the Compute node 418 of (01 01 02 14), again each excluding the sequence number field that has not yet been assigned, within the input content 926 have been reordered (e.g., swapped) within the EIS 908. As described above in association with the EIS 904, this reordering is based upon a left-to-right sort of the "to node" and the "from node" areas of each EIS array. Within the EIS 908, the element (02) of the numerical array for the "from node" (e.g., node type field 538) information of the Compute node 418 is greater than the element (01) of the numerical array for the "from node" (e.g., node type field 538) information of the MQInput1 node 432. As such, the numerical array for the MQInput1 node 432 has been reordered via the sorting process at this stage to be the first numerical array within the input content 926.

Similar sort processing also resulted in reordering of the numerical arrays of the input content 928. As can be seen from FIG. 10, the enclosed circle 1006 shows that the numerical arrays associated with the Trace node 426 of (01 01 02 17) and the MQInput node 402 of (01 07 01 01), again each excluding the sequence number field that has not yet been assigned, within the input content 928 have been reordered (e.g., swapped) within the EIS 910. As described above in association with the EIS 904, this reordering is based upon a left-to-right sort of the "to node" and the "from node" areas of each EIS array. Within the EIS 910, the element (07) of the numerical array for the "from node" (e.g., output terminal type field 536) information of the MQInput node 402 is greater than the element (01) of the numerical array for the "from node" (e.g., output terminal type field 536) information of the Trace node 426. As such, the numerical array for the Trace node 426 has been reordered via the sorting process at this stage to be the first numerical array within the input content 928.

The next sort stage, the results of which are shown within FIG. 11 below, is based upon use of all sort keys SK1 through SK13 shown in FIG. 7, including a left-to-right sort of the node information field 508, the node connection count field 514, the output (O/P) connection field 520, and the input (I/P) connection field 522 for the respective EIS structures 902 through 910 within the EIS array 900, again excluding the sequence numbers that have not yet been assigned. Assignment of the sequence numbers will be described in detail beginning with FIG. 11. The "to node" fields and the "from node" fields may be used if sorting of the left-most fields results in ambiguity as to whether a sort of the respective EIS structures within the EIS array 900 should be performed. Sorting of the EIS structures 902 through 910 within the EIS array 900 results within the present example to reorder the EIS 902 and the EIS 904, as described in more detail below.

Regarding the sort using all sort keys to sort the EIS 902 through 910 within the EIS array 900, it can be seen from FIG. 10 with reference to FIG. 5, again noting that the reserved field 504 is always zeros within the present example and the sequence number field 506 is being ignored at the present stage of processing, that the numerical values of all node type fields 510, as enclosed within the dashed-line circle 1008 are either identical in value or already in increasing numerical order from top to bottom within the EIS array 900. As such, within the present example, no sorting is performed based upon the node type fields 510 of the respective EIS structures. Continuing with the left-to-right sort, sorting now continues among EIS structures with identical node type fields 510. Accordingly, a potential sort between the EIS 902 and the EIS 904 (e.g., with identical node type fields 510 of value "01") may be considered, as well as a potential sort between the EIS 906 and the EIS 908 (with identical node type fields 510 of value "02"). Given that the node type field 510 of the EIS 910 is 03 and is already in the bottom-most position of the EIS array 900, no further sorting for this node will be performed within the present example. As described above, the input (I/P) connection field 522 sorting has already been performed.

Regarding a potential sort between the EIS 902 and the EIS 904, the numerical values of the node ID field 512 encircled within the dashed-line circle 1010 of each EIS structure are also identical. As such, no further sorting based upon this field will be performed within the present example as between the EIS 902 and the EIS 904. Further, with reference to the remaining fields of the node connection field 514 of the EIS 902 and the EIS 904, these remaining values are also identical as shown encircled within the dashed-line circle 1012 (e.g., both field pairs have values of "02 00"). Accordingly, sorting of the EIS 902 and the EIS 904 may be considered as resulting in ambiguity between the two EIS structures based upon the node information field 508 and the node connection count field 514.

To resolve the ambiguity, the sort processing again considers the output (O/P) connection field 520 and the input (I/P) connection field 522 of the respective EIS structures. Within the present example, each of the EIS 902 and the EIS 904 include values within the output (O/P) connection field 520, as represented within the output content 916 and the output content 918. Again performing a left-to-right sort of the respective fields, it can be seen from the values enclosed within the dashed-line circle 1014 and 1016 that any potential ambiguity between ordering of the EIS 902 and the EIS 904 is resolved at within the output terminal type field 524. The values enclosed within the dashed-line circle 1014 (e.g., 01 and 07) are greater than the values enclosed within the dashed-line circle 1016 (e.g., 01 and 01). As such, the EIS 902 and the EIS 904 should be reordered within the EIS array 900. This reordering is shown below within FIG. 11.

Regarding a potential sort between the EIS 906 and the EIS 908 with identical node type field 510 values, the numerical values of the node ID field 512 encircled within the dashed-line circle 1018 of each EIS structure are already in increasing numerical order (e.g., the node ID field 512 of the EIS 908 with a value of "17" is greater than the node ID field 512 of the EIS 906 with a value of "14"). Further, the EIS 908 with the greater value in the node ID field 512 is already the bottom-most EIS structure between the two EIS structures 906 and 908 with identical node type field 510, as described above. As such, no further sorting between the EIS 906 and the EIS 908 based upon values of the EIS 906 and the EIS 908 will be performed within the present example.

Figure 11:
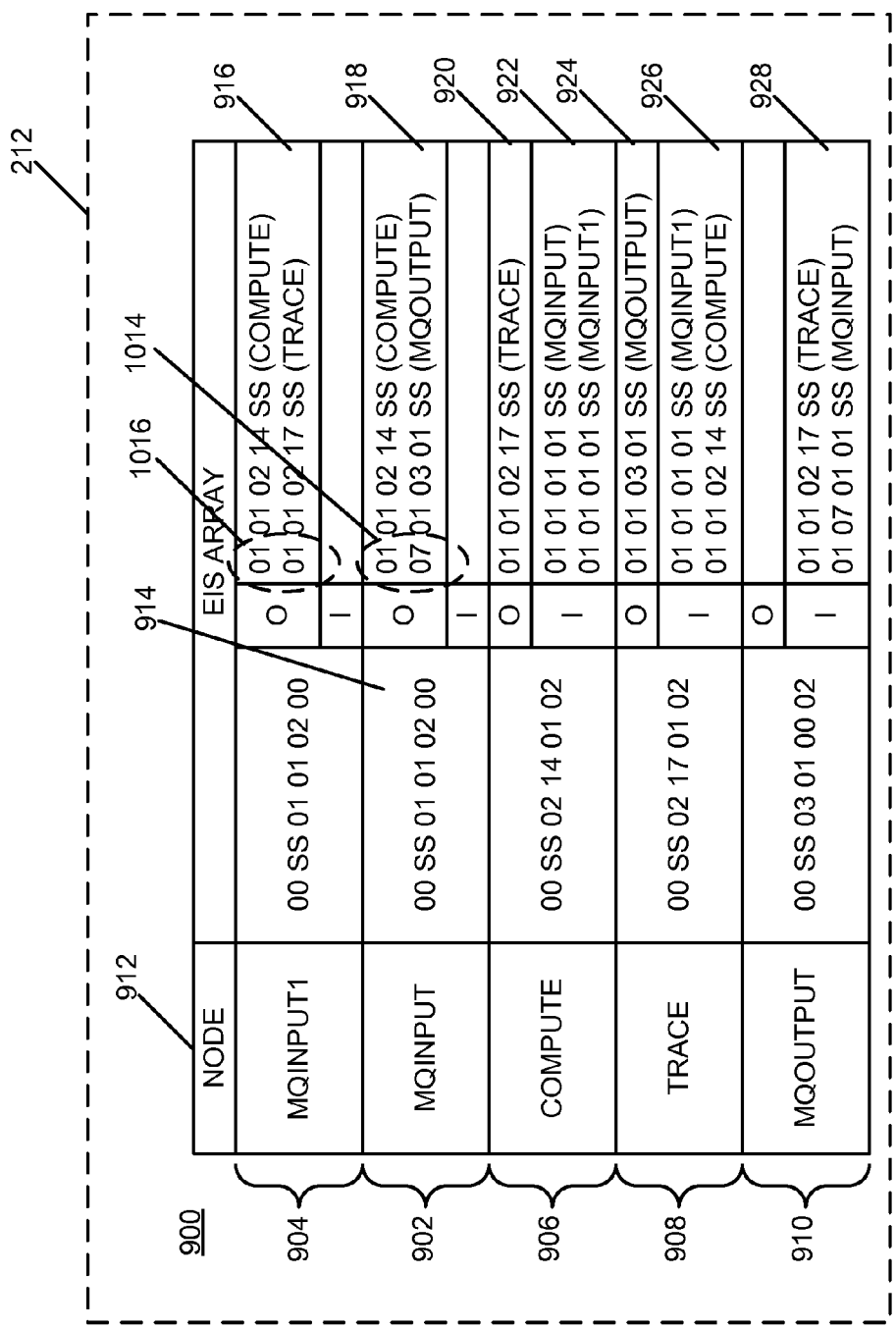
FIG. 11 is a diagram of an example of an implementation of the EIS array of FIG. 10 sorted based upon application of all sort keys to reorder the EIS structures within the EIS array of FIG. 10 according to an embodiment of the present subject matter.

FIG. 11 is a diagram of an example of an implementation of the EIS array 900 of FIG. 10 sorted based upon application of all sort keys SK1 through SK13 to reorder the EIS 902 through the EIS 910 within the EIS array 900. It can be seen from FIG. 11 that, based upon the numerical content of the respective fields of the EIS 902 through the EIS 910 within the EIS array 900, as described above, the EIS 902 has been swapped/reordered with the EIS 904 within the EIS array 900. Within the present example, this reordering via sorting is the result of the "terminal type" represented within the dashed-line encircled column 1014 of content for the output (O/P) terminal type field 524 for the EIS 902, which includes the elements (numerical pairs) of (01 07) and which are greater in combination than the values of the dashed-line encircled column 1016 of content for the output (O/P) terminal type field 524 for the EIS 904, which includes the elements (numerical pairs) of (01 01). As such, the EIS 902 is sorted and reordered to be placed after the EIS 904 within FIG. 11. No additional sorting is performed to sequence the EIS structures, as described above, based upon the numerical values used within the present example.

Figure 12:
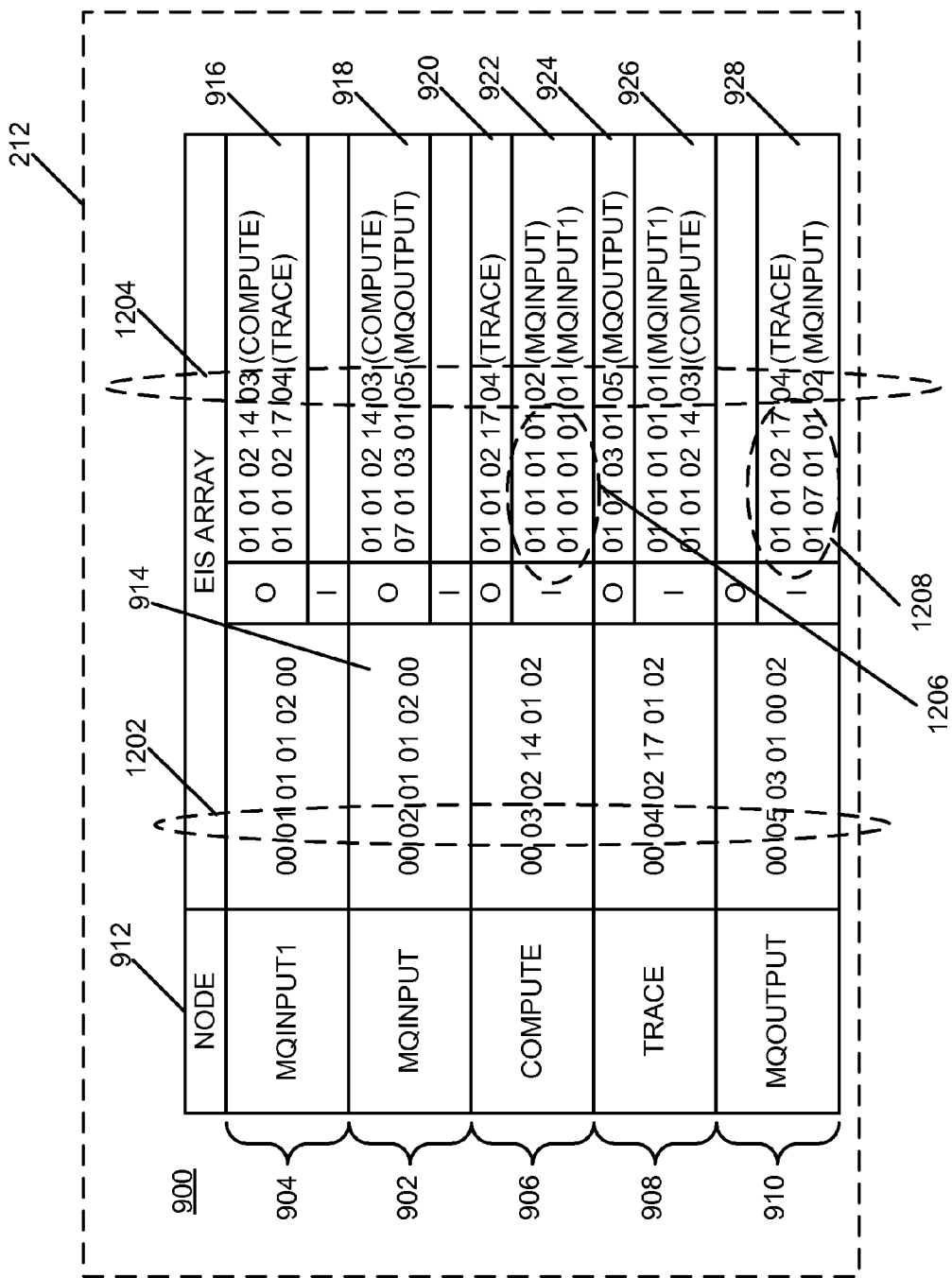
FIG. 12 is a diagram of an example of an implementation of the EIS array of FIG. 11 with the primary sequence number fields for the element information structures and the "to node" and "from node" sequence numbers filled in with the respective assigned sequence number of the connected nodes according to an embodiment of the present subject matter.

The next phase of sort processing fills in the sequence numbers of the sequence number field 506 and the respective sequence number field 532 and the sequence number field 542 of the output (O/P) connection field 520 and the input (I/P) connection field 522, respectively. FIG. 12 below shows this final stage of processing.

FIG. 12 is a diagram of an example of an implementation of the EIS array 900 of FIG. 11 with the primary sequence number fields for the element information structures and the "to node" and "from node" sequence numbers filled in with the respective assigned sequence number of the connected nodes. As can be seen from FIG. 12, the sequence number field 506 has been filled in sequentially as shown enclosed within the dashed-line encircled column 1202. Accordingly, the EIS 902 through the EIS 910 are considered sequenced based upon the sorting described above and have their sequence numbers assigned. Further, the sequence number field 532 and the sequence number field 542 of each of the EIS 902 through the EIS 910 have been filled in with the assigned sequence number from the sequence number field 506 of each node to which the respective terminal is connected, as enclosed within the dashed-line circle 1204. For example, within the output content 916, the sequence number field 532 of each of the numerical arrays has been filled in with the assigned sequence number of the respective "to node" (e.g., 03 which is the assigned sequence number of the sequence number field 506 of the Compute node 418 from EIS 906, and 04 which is the assigned sequence number of the sequence number field 506 of the Trace node 416 from EIS 908) as enclosed within the dashed-line circle 1204. Similar processing is performed for the remaining EIS 902, EIS 906, EIS 908, and EIS 910 to fill in all "to node" and "from node" sequence numbers. For purposes of the present description, filling in the sequence numbers "maps" the input and output connections to the respective EIS structure to which a node is connected, and that has the respective assigned sequence number.

An additional sort may be applied if the EIS details apart from sequence are identical, such as to sequence the output (O/P) connection field 520 and the input (I/P) connection field 522 within the respective EIS 902 through the EIS 910 based upon the assigned sequence numbers that have been filled into (e.g., populated into) the sequence number field 532 and the sequence number field 542 of each EIS structure. It should be noted that only content fields 916 through 928 with more than one numerical array will be considered for further sorting. Further, only where prior sorting may be considered to include potential ambiguity (e.g., where all values are identical other than the filling in assigned sequence numbers) will additional sorting be performed.

As such, as can be seen from FIG. 12, applying the previously-described sorting with consideration at this stage of processing of the sequence number field 532 and the sequence number field 542 would result in no additional changes as a result of the sequence numbers for the EIS 904 and the EIS 902. Further, the sequence numbers for the EIS 904 and the EIS 902 are already numerically sequenced with the bottom-most value within the dashed-line circle 1204 having the greatest value. Similar analysis applies to EIS 908. However, it is noted that the EIS 906 and the EIS 910 have sequence numbers without the greater number in the bottom-most position of the respective EIS structure. As such, applying the previously-described sorting with consideration at this stage of processing of the sequence number field 532 and the sequence number field 542 may result in reordering of the numerical arrays within the output (O/P) connection field 520 and the input (I/P) connection field 522.

With reference to the EIS 906, all values of the fields to the left of the sequence number field 542 enclosed within the dashed-line circle 1206 within the input content 922 are identical (e.g., each array is identical with values "01 01 01 01"). As such, these fields of the EIS 906 may be considered ambiguous and further sorting based upon the sequence number field 542 may resolve ambiguity between the respective numerical arrays of the input content 922. Accordingly, applying the previously-described sorting with consideration at this stage of processing of the sequence number field 542 would result in a determination that the numeral arrays within the input content 922 associated with the MQInput node 402 and the MQInput1 node 432 should be reordered.

However, with reference to the EIS 910, the values of the fields to the left of the sequence number field 542 enclosed within the dashed-line circle 1208 within the input content 928 are already sorted based upon the left-to-right sorting to be in increasing order (e.g., the value "07" is greater than the value "01" within the output terminal type field 536). Accordingly, applying the previously-described sorting with consideration at this stage of processing of the sequence number field 542 would result in a determination that the numeral arrays within the input content 928 associated with the Trace node 426 and the MQInput node 402 should not be reordered.

Figure 13:
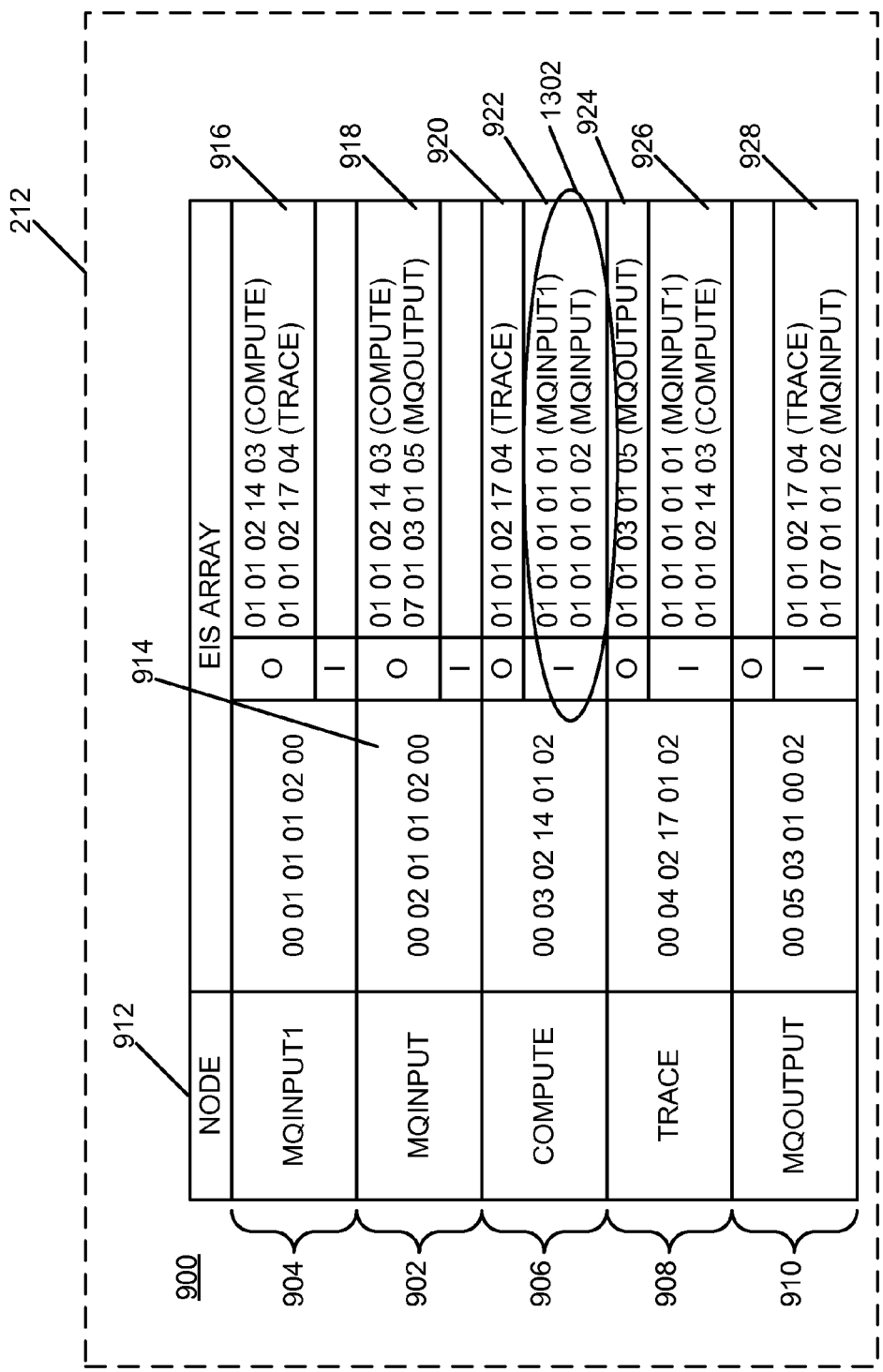
FIG. 13 is a diagram of an example of an implementation of the EIS array of FIG. 12 showing further sorting based upon the "to node" and "from node" sequence numbers being filled in with the respective assigned sequence number of the connected nodes according to an embodiment of the present subject matter.

FIG. 13 is a diagram of an example of an implementation of the EIS array 900 of FIG. 12 showing further sorting based upon the "to node" and "from node" sequence numbers being filled in with the respective assigned sequence number of the connected nodes. As can be seen from FIG. 13, the numerical array associated with the MQInput1 node 432 has been sorted and swapped with the numerical array associated with the MQInput node 402, as enclosed within the circle 1302, and the numerical arrays are shown to be in a numerically increasing sequence. As such, all EIS structures within the EIS array 900 are intra-sequenced and inter-sequenced at this point in a numerically increasing manner. The sorting may now be considered completed.

Figure 14:
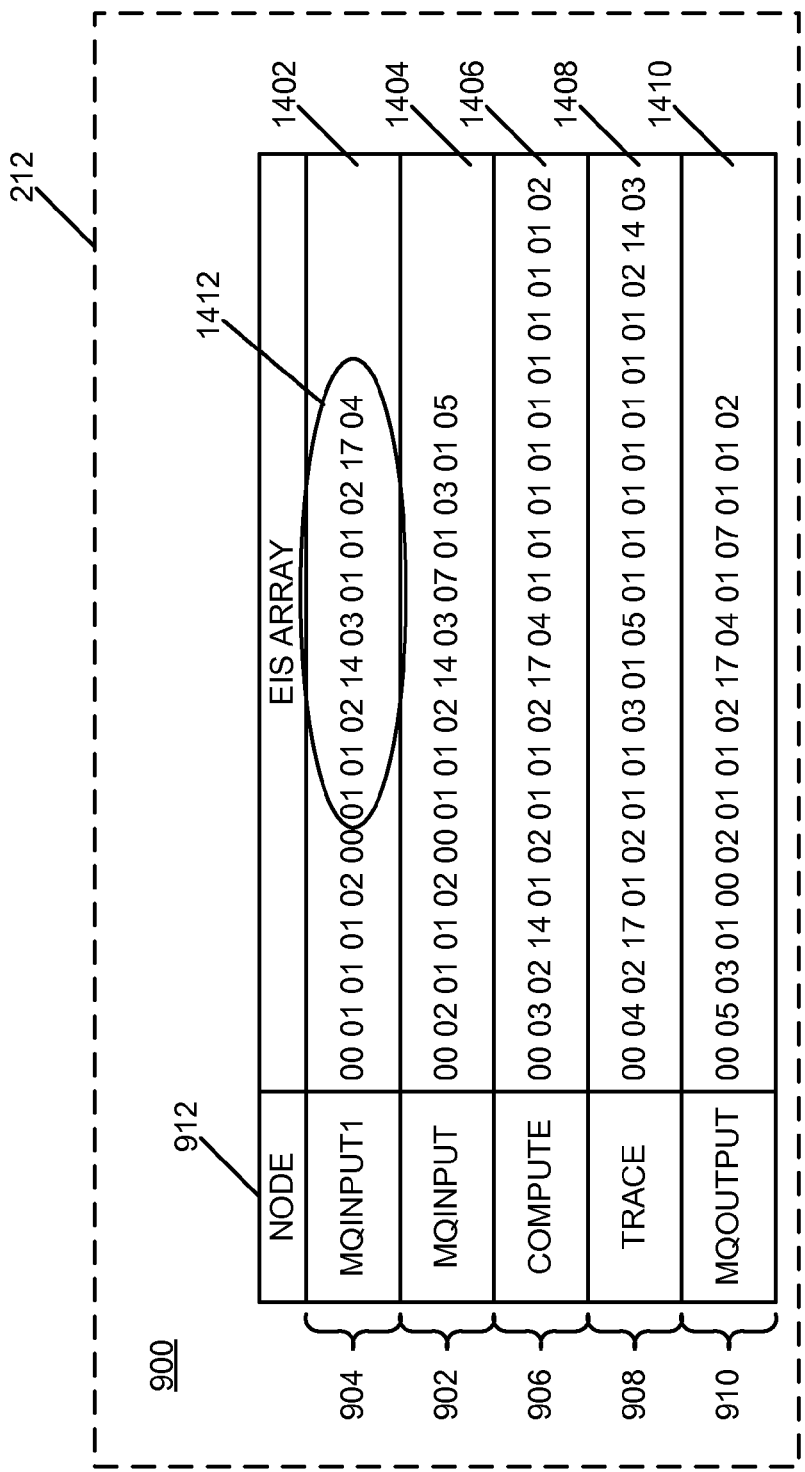
FIG. 14 is a diagram of an example of an implementation of the EIS array of FIG. 13 in a final form with the respective numerical arrays sequenced into continuous arrays according to an embodiment of the present subject matter.

FIG. 14 is a diagram of an example of an implementation of the EIS array 900 of FIG. 13 in a final form with the respective numerical arrays sequenced into continuous arrays. As can be seen from FIG. 14, a numerical array 1402 has been formed from the respective numerical arrays of the EIS 904. Similarly, a numerical array 1404 has been formed from the respective numerical arrays of the EIS 902, a numerical array 1406 has been formed from the respective numerical arrays of the EIS 906, a numerical array 1408 has been formed from the respective numerical arrays of the EIS 908, and a numerical array 1410 has been formed from the respective numerical arrays of the EIS 910.

Using the EIS 904 as an example, and again with reference to FIG. 5, the numerical array 1402 includes the node information field 508 and the node connection count field 514 followed by an enclosed portion of the numerical array 1402 encircled within the circle 1412. The circle 1412 encloses the sequenced numerical arrays for the output (O/P) connection field 520 that represent the Compute node 418 and the Trace node 426 from left to right. Similar processing was performed for each other EIS structure to form the numerical array 1404 through the numerical array 1410, based upon the content of the respective EIS structures.

The EIS array 900 encoded as the numerical arrays 1402 through 1410 may be used for numerical comparison with other EIS arrays generated based upon different structured language representations, such as source XML code representations (or other encoded representations, whether the same or different originating syntax) of other graphical flows. As such, two distinctive structured language representations may be converted to binary arrays of numbers and line-by-line comparison of the numerical arrays may be performed instead of element-by-element XML comparison. If a difference is found between the respective EIS arrays, the processing described herein may determine that the two business logic flows that resulted in the captured structural representations and the converted EIS arrays represent different business logic. However, if the structural representations represent the same logic, the processing described herein may determine that the two or more EIS arrays represent the same business logic. A description of additional examples of processing for comparing EIS arrays is described below beginning with FIG. 15.

It should additionally be noted that the numerical arrays 402 through 410 provide a compact numerical storage format for graphical flow diagrams, such as the graphical flow 400. Further, graphical flow diagrams may be recreated from an EIS array by processing to generate nodes from the respective node types, node IDs, terminal types, connections, etc. Many other possibilities exist for processing associated with the present subject matter and all are considered within the scope of the present subject matter.

FIG. 15 is a flow chart of an example of an implementation of a process 1500 for automated numerical graphical flow diagram conversion. At block 1502, the process 1500 translates, via a computing device, each of a plurality of user interface element representations that each represents one node of a captured graphical logic flow into one of a plurality of numerical strings that represents the respective node and connections to and from the respective node. At block 1504, the process 1500 sequences the plurality of numerical strings based upon the connections to and from each represented node.

FIG. 16 is a flow chart of an example of an implementation of a process 1600 for automated numerical graphical flow diagram conversion and comparison. At decision point 1602, the process 1600 makes a determination as to whether a request to compare logic flows between multiple captured logic flows has been detected. A request to compare logic flows between multiple captured logic flows may be detected, for example, in response to a user input request detected via the input device 204, or in response to completion of translation and sorting of one or more logic flows, as described above. In response to determining that a request to compare logic flows between multiple captured logic flows has been detected, the process 1600 converts (e.g., translates) the multiple logic flows to numeric element information structure (EIS) arrays using enumeration tables, as described above, at block 1604. Converting or translating the multiple logic flows to numeric element information structure (EIS) arrays using enumeration tables may include traversing a group of user interface element representations, such as structural language representations (e.g., XML or other structural language representations), and enumerating each represented node as one of a group of numerical strings based upon a node type of each represented node and a type of each input and output terminal associated with each connection to and from each represented node. Enumerating each represented node may include creating (e.g., forming), for each represented node, an element information structure (EIS) within a memory using at least one enumeration table that includes at least one numerical representation that defines at least one of the node type and the terminal type associated with each input and output terminal associated with each of the connections to and from the node. As such, each element information structure may include information associated with the respective node represented within each EIS and connection information for each other node to which the respective represented node is connected.

At block 1606, the process 1600 stores each EIS element as an array in memory, such as the numerical flow information storage area 212 of the memory 208. At block 1608, the process 1600 applies sorting and sequencing to each captured numeric representation of a logic flow. As described above, applying the sorting and sequencing to each captured numeric representation of a logic flow may include forming an array of the element information structures created for each represented node within the memory 208, where each element information structure comprises information associated with the respective represented node and connection information for each other node to which the respective represented node is connected, sorting the array of the element information structures based upon the connections to and from each represented node using the connection information for each other node to which each respective node is connected, and re-ordering the array of the element information structures in response to sorting the array of the element information structures. After initial re-ordering, sequence numbers may be assigned to the element information structures of the EIS array based upon a position of each element information structure within the re-ordered EIS array. Sequence numbers may be populated (e.g., mapped) within the connection information within each element information structure for each node to which each respective represented node is connected based upon the assigned sequence numbers of each element information structure, and the EIS array may be sorted again using the populated (e.g., mapped) sequence numbers, such as for example, via the "to node" and "from node" attributes of the respective element information structures. Sequencing each group of numerical strings based upon the connections to and from each represented node may further include sorting the groups of numerical strings into a numerically increasing sequence, and may include logically grouping the group of user interface element representations based upon at least one characteristic of each represented node selected from a group including a node type, input connections to the represented node, and output connections to the represented node.

At decision point 1610, the process 1600 makes a determination as to whether at least two of the multiple numeric EIS arrays are identical. This determination may include comparing the sequenced group of numerical strings of each logic flow and determining whether the plurality of user interface element representations and each numerically represented user interface element representation are logically equivalent based upon the comparison of the multiple sequenced groups of numerical strings.

In response to determining that at least two of the multiple numeric EIS arrays are identical, the process 1600 indicates that two of the graphical logic flow representations are identical at block 1612. For purposes of the present example, the indication that at least two of the multiple numeric EIS arrays are identical may be output to a display device, such as the display 202, may be forwarded to an administrator or provided to other control processing, or may be indicated in any other manner appropriate for a given implementation. In response to determining that at least two numeric EIS arrays are not identical, the process 1600 indicates that at least two of the graphical logic flow representations are not identical at block 1614. Again, for purposes of the present example, the indication that at least two of the multiple numeric EIS arrays are not identical may be output to a display device, such as the display 202, may be forwarded to an administrator or provided to other control processing, or may be indicated in any other manner appropriate for a given implementation.

In response to indicating that at least two of the graphical logic flow representations are identical at block 1612 or that at least two of graphical logic flow representations are not identical at block 1614, the process 1600 returns to decision point 1602 to await a new request to compare captured logic flows.

As such, the process 1600 processes multiple graphical logic flows captured in one or more structural language representations and converts each captured structural language representation to a numeric format as an element information structure (EIS) using enumeration tables. The process 1600 stores the created EIS arrays to memory and sorts and sequences the respective EIS arrays that represent each structural language representation of a captured logic flow, as described in detail above. The process 1600 then compares the sorted numeric EIS arrays to determine whether the logic represented within the captured structural language representations are identical or different, and reports the determination.

As described above in association with FIG. 1 through FIG. 16, the example systems and processes provide numerical graphical flow diagram conversion and comparison. Many other variations and additional activities associated with numerical graphical flow diagram conversion and comparison are possible and all are considered within the scope of the present subject matter.

Those skilled in the art will recognize, upon consideration of the above teachings, that certain of the above examples are based upon use of a programmed processor, such as the CPU 200. However, the invention is not limited to such example embodiments, since other embodiments could be implemented using hardware component equivalents such as special purpose hardware and/or dedicated processors. Similarly, general purpose computers, microprocessor based computers, micro-controllers, optical computers, analog computers, dedicated processors, application specific circuits and/or dedicated hard wired logic may be used to construct alternative equivalent embodiments.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention have been described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable storage medium that can direct a computer or other programmable data processing apparatus to function in a particular manner, such that the instructions stored in the computer-readable storage medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modems and Ethernet cards are just a few of the currently available types of network adapters.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method, comprising:
    translating, via a computing device using numeric process flow element attribute type identifiers and numeric process flow graphical interconnection attribute type identifiers, each of a plurality of structured language graphical process flow element representations, that each represents within a structured language one processing node of a captured graphical process flow diagram of a first business process and connections to and from the respective processing node, into one of a plurality of numerical strings that each numerically represents within a plurality of data fields the respective processing node and the connections to and from the respective processing node, where translating each of the plurality of structured language graphical process flow element representations comprises:
        traversing the plurality of structured language graphical process flow element representations; and
        enumerating each represented processing node as one of the plurality of numerical strings based upon a processing node type of each represented processing node and a terminal type of each input and output terminal associated with each connection to and from each represented processing node, where enumerating each represented processing node comprises:
            creating, for each represented processing node, an element information structure (EIS) within a memory using at least one enumeration table that comprises at least one numerical representation that defines within the respective data fields at least one of the processing node type and the terminal type of each input and output terminal associated with each connection to and from each represented processing node; and
    where the method further comprises sequencing the plurality of numerical strings in accordance with values of the respective data fields within each numerical string that represents the respective processing node and the connections to and from each represented processing node of the captured graphical process flow diagram of the first business process.

2. The method of claim 1, where sequencing the plurality of numerical strings in accordance with the values of the respective data fields within each numerical string that represents the respective processing node and the connections to and from each represented processing node of the captured graphical process flow diagram of the first business process comprises sorting the plurality of numerical strings into a numerically increasing sequence.

3. The method of claim 1, where sequencing the plurality of numerical strings in accordance with the values of the respective data fields within each numerical string that represents the respective processing node and the connections to and from each represented processing node of the captured graphical process flow diagram of the first business process comprises logically grouping the plurality of structured language graphical process flow element representations in accordance with at least one characteristic of each represented processing node selected from a group consisting of the processing node type, input connections to the represented processing node, and output connections to the represented processing node.

4. The method of claim 1, where the plurality of structured language graphical process flow element representations comprises a plurality of structured language graphical process flow element representations of the first business process captured in the structured language comprising extensible markup language (XML).

5. The method of claim 1, where the sequenced plurality of numerical strings numerically represents the first business process, and further comprising:
    comparing the sequenced plurality of numerical strings with a second sequenced plurality of numerical strings that numerically represents a second business process initially captured as a second plurality of structured language graphical process flow element representations;
    determining whether the first business process and the second business process are logically equivalent based upon the comparison of the sequenced plurality of numerical strings to the second sequenced plurality of numerical strings; and
    outputting to a display device an indication of whether the first business process and the second business process are logically equivalent.

6. A computer program product comprising a non-transitory computer readable storage device including computer readable program code, where the computer readable program code when executed on a computer causes the computer to:
    translate, using numeric process flow element attribute type identifiers and numeric process flow graphical interconnection attribute type identifiers, each of a plurality of structured language graphical process flow element representations, that each represents within a structured language one processing node of a captured graphical process flow diagram of a first business process and connections to and from the respective processing node, into one of a plurality of numerical strings that each numerically represents within a plurality of data fields the respective processing node and the connections to and from the respective processing node, where in causing the computer to translate each of the plurality of structured language graphical process flow element representations, the computer readable program code when executed on the computer causes the computer to:
        traverse the plurality of structured language graphical process flow element representations; and
        enumerate each represented processing node as one of the plurality of numerical strings based upon a processing node type of each represented processing node and a terminal type of each input and output terminal associated with each connection to and from each represented processing node, where in causing the computer to enumerate each represented processing node, the computer readable program code when executed on the computer causes the computer to:
create, for each represented processing node, an element information structure (EIS) using at least one enumeration table that comprises at least one numerical representation that defines within the respective data fields at least one of the processing node type and the terminal type of each input and output terminal associated with each connection to and from each represented processing node; and
where the computer readable program code when executed on the computer further causes the computer to sequence the plurality of numerical strings in accordance with values of the respective data fields within each numerical string that represents the respective processing node and the connections to and from each represented processing node of the captured graphical process flow diagram of the first business process.

7. The computer program product of claim 6, where, in causing the computer to sequence the plurality of numerical strings in accordance with the values of the respective data fields within each numerical string that represents the respective processing node and the connections to and from each represented processing node of the captured graphical process flow diagram of the first business process, the computer readable program code when executed on the computer causes the computer to sort the plurality of numerical strings into a numerically increasing sequence.

8. The computer program product of claim 6, where, in causing the computer to sequence the plurality of numerical strings in accordance with the values of the respective data fields within each numerical string that represents the respective processing node and the connections to and from each represented processing node of the captured graphical process flow diagram of the first business process, the computer readable program code when executed on the computer causes the computer to logically group the plurality of structured language graphical process flow element representations in accordance with at least one characteristic of each represented processing node selected from a group consisting of the processing node type, input connections to the represented processing node, and output connections to the represented processing node.

9. The computer program product of claim 6, where the plurality of structured language graphical process flow element representations comprises a plurality of structured language graphical process flow element representations of the first business process captured in the structured language comprising extensible markup language (XML).

10. The computer program product of claim 6, where the sequenced plurality of numerical strings numerically represents the first business process, and where the computer readable program code when executed on the computer further causes the computer to:
compare the sequenced plurality of numerical strings with a second sequenced plurality of numerical strings that numerically represents a second business process initially captured as a second plurality of structured language graphical process flow element representations;
determine whether the first business process and the second business process are logically equivalent based upon the comparison of the sequenced plurality of numerical strings to the second sequenced plurality of numerical strings; and
output to a display device an indication of whether the first business process and the second business process are logically equivalent.

11. The computer program product of claim 6, where the computer program product is in the form of a computer system, with the computer program product further comprising:
a processor(s) set structured, programmed, and/or connected to execute the computer readable program code stored in the non-transitory computer readable storage device.

12. The computer program product of claim 7, where the computer program product is in the form of a computer system, with the computer program product further comprising:
a processor(s) set structured, programmed, and/or connected to execute the computer readable program code stored in the non-transitory computer readable storage device.

13. The computer program product of claim 8, where the computer program product is in the form of a computer system, with the computer program product further comprising:
a processor(s) set structured, programmed, and/or connected to execute the computer readable program code stored in the non-transitory computer readable storage device.

14. The computer program product of claim 9, where the computer program product is in the form of a computer system, with the computer program product further comprising:
a processor(s) set structured, programmed, and/or connected to execute the computer readable program code stored in the non-transitory computer readable storage device.

15. A method, comprising:
receiving, by a computing device, a structured language definition defining a structured language and comprising a plurality of process flow element representations each respectively representing one type of processing node for use in graphical process flow diagrams, with each process flow element representation being characterized by at least: (i) a numeric process flow element attribute type identifier, and (ii) a numeric process flow graphical interconnection attribute type identifier;
receiving, by the computing device, a graphical process flow diagram data set representing a graphical process flow diagram comprising a plurality of processing nodes and a plurality of connections among and between the plurality of processing nodes, with the graphical process flow diagram representing a process flow in a human understandable way; and
translating, by the computing device, the graphical process flow diagram into a structured language data set formed and formatted according to the structured language so that: (i) each given processing node of the plurality of processing nodes is respectively represented by an instance process flow element representation having an appropriate numeric process flow element attribute type identifier, and (ii) each given connection of the plurality of connections is respectively represented by appropriate numeric process flow graphical interconnection attribute type identifiers of the instances of the process flow element representations subject to the given connection, where translating, by the computing device, the graphical process flow diagram into the structured language data set comprises:

traversing the plurality of processing nodes; and enumerating each processing node as one of a plurality of numerical strings based upon the respective processing node type of each processing node and a terminal type of each input and output terminal associated with each connection to and from each processing node, where enumerating each processing node comprises:

creating, for each processing node, an element information structure (EIS) within a memory using at least one enumeration table that comprises at least one numerical representation that defines within respective data fields for each processing node at least one of the processing node type and the terminal type of each input and output terminal associated with each connection to and from each processing node.

16. The method of claim 15, further comprising:

executing an instance of the process flow to obtain process results.

\* \* \* \* \*